(12) United States Patent
Kohiki

(10) Patent No.: US 9,839,124 B2
(45) Date of Patent: Dec. 5, 2017

(54) COPPER FOIL PROVIDED WITH CARRIER, LAMINATE, PRINTED WIRING BOARD, ELECTRONIC DEVICE AND METHOD FOR FABRICATING PRINTED WIRING BOARD

(71) Applicant: JX NIPPON MINING & METALS CORPORATION, Tokyo (JP)

(72) Inventor: Michiya Kohiki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 59 days.

(21) Appl. No.: 15/015,551

(22) Filed: Feb. 4, 2016

(65) Prior Publication Data

US 2016/0234935 A1 Aug. 11, 2016

(30) Foreign Application Priority Data

Feb. 6, 2015 (JP) ................................ 2015-022740

(51) Int. Cl.
| | |
|---|---|
| H05K 1/09 | (2006.01) |
| H05K 3/00 | (2006.01) |
| C25D 1/04 | (2006.01) |
| H05K 3/20 | (2006.01) |
| C25D 7/06 | (2006.01) |

(Continued)

(52) U.S. Cl.
CPC ............... H05K 1/09 (2013.01); C25D 1/04 (2013.01); C25D 7/0614 (2013.01); H05K 3/0058 (2013.01); H05K 3/025 (2013.01); H05K 3/205 (2013.01); H05K 3/4007 (2013.01); H05K 3/421 (2013.01); C23C 18/1653 (2013.01); C25D 3/04 (2013.01); C25D 3/18 (2013.01); C25D 3/38 (2013.01); C25D 3/562 (2013.01); C25D 5/14 (2013.01); H05K 2201/0355 (2013.01); H05K 2201/0367 (2013.01); H05K 2201/0376 (2013.01); H05K 2201/09509 (2013.01); H05K 2203/0152 (2013.01); H05K 2203/0156 (2013.01); H05K 2203/0307 (2013.01); H05K 2203/0723 (2013.01); H05K 2203/0726 (2013.01)

(58) Field of Classification Search
None
See application file for complete search history.

(56) References Cited

U.S. PATENT DOCUMENTS

| | | | |
|---|---|---|---|
| 5,114,543 A | 5/1992 | Kajiwara et al. | |
| 6,827,867 B2 | 12/2004 | Yamamoto et al. | |

(Continued)

FOREIGN PATENT DOCUMENTS

| | | |
|---|---|---|
| EP | 2615196 A1 | 7/2013 |
| JP | 1999140281 A | 5/1999 |

(Continued)

*Primary Examiner* — David Sample
*Assistant Examiner* — Donald M. Flores, Jr.
(74) *Attorney, Agent, or Firm* — Drinker Biddle & Reath LLP

(57) ABSTRACT

Provided is a copper foil provided with a carrier in which the laser hole-opening properties of the ultrathin copper layer are good and which is suitable for producing a high-density integrated circuit substrate. A copper foil provided with a carrier having, in order, a carrier, an intermediate layer, and an ultrathin copper layer, wherein the specular gloss at 60° in an MD direction of the intermediate layer side surface of the ultrathin copper layer is 140 or less.

8 Claims, 5 Drawing Sheets

(51) Int. Cl.
  *H05K 3/02* (2006.01)
  *H05K 3/40* (2006.01)
  *H05K 3/42* (2006.01)
  *C25D 3/04* (2006.01)
  *C25D 3/18* (2006.01)
  *C25D 3/38* (2006.01)
  *C25D 3/56* (2006.01)
  *C25D 5/14* (2006.01)
  *C23C 18/16* (2006.01)

(56) References Cited

U.S. PATENT DOCUMENTS

2004/0163842 A1* 8/2004 Okada ................... C23C 26/00
                                                              174/254
2004/0188263 A1* 9/2004 Sugimoto ........... H05K 3/0038
                                                              428/612

FOREIGN PATENT DOCUMENTS

| JP | 1999005828 A | 12/1999 |
|---|---|---|
| JP | 2000043188 A | 2/2000 |
| JP | 2000269637 A | 9/2000 |
| JP | 3261119 B2 | 2/2001 |
| JP | 3184485 B2 | 7/2001 |
| JP | 2002179772 A | 6/2002 |
| JP | 2003249739 A | 9/2003 |
| JP | 2003304068 A | 10/2003 |
| JP | 2004082687 A | 3/2004 |
| JP | 2004349654 A | 12/2004 |
| JP | 3612594 B2 | 1/2005 |
| JP | 2005053218 A | 3/2005 |
| JP | 3676375 B2 | 7/2005 |
| JP | 2005262506 A | 9/2005 |
| JP | 2006257153 A | 9/2006 |
| JP | 3949676 B2 | 7/2007 |
| JP | 3992225 B2 | 10/2007 |
| JP | 4025177 B2 | 12/2007 |
| JP | 2007326923 A | 12/2007 |
| JP | 2008111169 A | 5/2008 |
| JP | 4136509 B2 | 8/2008 |
| JP | 4178415 B2 | 11/2008 |
| JP | 2009004423 A | 1/2009 |
| JP | 2009067029 A | 4/2009 |
| JP | 4286060 B2 | 6/2009 |
| JP | 2009173017 A | 8/2009 |
| JP | 4570070 B2 | 10/2010 |
| JP | 2011014727 A | 1/2011 |
| JP | 4828427 B2 | 11/2011 |
| JP | 5024930 B2 | 9/2012 |
| JP | 5046927 B2 | 10/2012 |
| JP | 2013019056 A | 1/2013 |
| JP | 5180815 B2 | 4/2013 |
| JP | 2014208481 A | 11/2014 |
| JP | 2014208909 A | 11/2014 |
| JP | 2014208910 A | 11/2014 |
| WO | 1997002728 A1 | 1/1997 |
| WO | 2004005588 A1 | 1/2004 |
| WO | 2006028207 A1 | 3/2006 |
| WO | 2006134868 A1 | 12/2006 |
| WO | 2007105635 A1 | 9/2007 |
| WO | 2008004399 A1 | 1/2008 |
| WO | 2008053878 A1 | 5/2008 |
| WO | 2008114858 A1 | 9/2008 |
| WO | 2009001850 A1 | 12/2008 |
| WO | 2009008471 A1 | 1/2009 |
| WO | 2009084533 A1 | 7/2009 |
| WO | 2009145179 A1 | 12/2009 |
| WO | 2011068157 A1 | 6/2011 |

* cited by examiner

EXPOSURE AND DEVELOPMENT

CIRCUIT PLATING AND RESIST REMOVAL

RESIN AND COPPER FOIL PROVIDED WITH A
CARRIER LAMINATION

RELEASE OF SECOND LAYER OF CARRIER FOIL

LASER HOLE OPENING

VIA FILL

SECOND LAYER CIRCUIT PLATING

RELEASE OF FIRST LAYER CARRIER FOIL

FLASH ETCHING

BUMP AND COPPER PILLAR FORMATION

COPPER FOIL PROVIDED WITH CARRIER, LAMINATE, PRINTED WIRING BOARD, ELECTRONIC DEVICE AND METHOD FOR FABRICATING PRINTED WIRING BOARD

TECHNICAL FIELD

The present invention relates to a copper foil provided with a carrier, a laminate, a printed wiring board, an electronic device and a method for fabricating a printed wiring board.

BACKGROUND ART

In general, a printed wiring board is fabricated through steps in which an insulating substrate is adhered to a copper foil to make a copper-clad laminate and a conductive pattern is formed on the copper foil surface by etching. High-density implementation of mounted components and handling of signals at higher frequencies have been progressed along with the increase of the recent needs for smaller electronic devices with a higher performance, and printed wiring boards are needed to have a fine conductive pattern (fine pitch) and to deal with high frequencies, for example.

Recently, while a copper foil having a thickness of 9 µm or less, or even a thickness of 5 µm or less has been required to cope with a fine pitch, such an ultrathin copper foil has a low mechanical strength, and is likely to tear or generate a wrinkle in fabricating a printed wiring board. Accordingly, a copper foil provided with a carrier has been developed in which an ultrathin copper layer is electrodeposited above a thick metal foil, which is utilized for a carrier, with a peel layer sandwiched therebetween. The surface of the ultrathin copper layer is pasted on an insulating substrate to heat and pressure-bond, and thereafter the carrier is peeled off and removed via the peel layer. A circuit pattern is formed with a resist on the exposed ultrathin copper layer and then a predetermined circuit is formed.

Here, in order to increase the integrated circuit density of a printed wiring board, a method is common in which a laser hole is formed and the inner layer and the outer layer are connected through the hole. In addition, because a method (MSAP: Modified-Semi-Additive-Process) in which a wiring circuit is formed on an ultrathin copper layer and the ultrathin copper layer is then etching-removed with a sulfuric acid-hydrogen peroxide etchant is employed for a method for forming a fine circuit in association with the popularization of a narrow pitch, the laser hole-opening properties of an ultrathin copper layer are an important matter of concern to produce a high-density integrated circuit substrate. The laser hole-opening properties of an ultrathin copper layer are involved in various conditions such as hole diameter precision and laser output and hence significantly influence the design and productivity of an integrated circuit.

In a common laser hole opening processing, the ultrathin copper layer surface is subjected to a blackening treatment or a fine irregularization treatment with a chemical solution in order to increase the absorbability to a laser wavelength, and thereafter laser hole opening is performed. However, along with the popularization of high integration, it has become common that the ultrathin copper layer surface is directly irradiated with a laser to open a laser hole without being subjected to the above treatments. The commonly used laser is a carbon dioxide laser and copper has a property to reflect the wavelength region of the laser. As a result, the laser hole-opening properties are not improved without performing a treatment such as roughening of the surface. As the technique, Patent Literature 1 discloses that a copper-clad laminate having good laser hole-opening properties can be provided using a waved copper foil for the outer layer copper foil of a copper-clad laminate.

CITATION LIST

Patent Literature

Patent Literature 1—Japanese Patent No. 3261119

SUMMARY OF INVENTION

Technical Problem

However, roughening the ultrathin copper layer surface causes a problem of the deterioration of the fine circuit formability. Accordingly, it is the object of the present invention to provide a copper foil provided with a carrier in which the laser hole-opening properties of the ultrathin copper layer are good and which is suitable for producing a high-density integrated circuit substrate.

Solution to Problem

As a result of diligent research to achieve the above object, the present inventors discovered that, by controlling the gloss of the intermediate layer side surface of the ultrathin copper layer in an MD direction (longitudinal direction, rolling direction) or the gloss of the intermediate layer side surface of the ultrathin copper layer in a TD direction (width direction, traverse direction), the absorption to a laser wavelength by the ultrathin copper layer is improved, and as a result a copper foil provided with a carrier in which the laser hole-opening properties of the ultrathin copper layer are good and which is suitable for producing a high-density integrated circuit substrate can be provided.

The present invention, which was completed based on the above knowledge, is, in one aspect, a copper foil provided with a carrier having, in order, a carrier, an intermediate layer, and an ultrathin copper layer, wherein the specular gloss at 60° in an MD direction of the intermediate layer side surface of the ultrathin copper layer is 140 or less.

In an embodiment of the copper foil provided with a carrier according to the present invention, the specular gloss at 60° in an MD direction of the intermediate layer side surface is 130 or less.

In another embodiment of the copper foil provided with a carrier according to the present invention, the specular gloss at 60° in an MD direction of the intermediate layer side surface is 120 or less.

The present invention is, in another aspect, a copper foil provided with a carrier having, in order, a carrier, an intermediate layer, and an ultrathin copper layer, wherein the specular gloss at 60° in a TD direction of the intermediate layer side surface of the ultrathin copper layer is 65 or less.

In yet another embodiment of the copper foil provided with a carrier according to the present invention, the specular gloss at 60° in a TD direction of the intermediate layer side surface of the ultrathin copper layer is 60 or less.

In yet another embodiment of the copper foil provided with a carrier according to the present invention, the specular gloss at 60° in a TD direction of the intermediate layer side surface of the ultrathin copper layer is 55 or less.

In yet another embodiment of the copper foil provided with a carrier according to the present invention, the average roughness Rz in an MD direction of the intermediate layer side surface of the ultrathin copper layer measured using a contact roughness meter is 1.5 μm or less.

In yet another embodiment of the copper foil provided with a carrier according to the present invention, the ten point average roughness Rz in an MD direction of the intermediate layer side surface of the ultrathin copper layer measured using a contact roughness meter is 0.80 μm or more.

In yet another embodiment of the copper foil provided with a carrier according to the present invention, the average roughness Rz in a TD direction of the intermediate layer side surface of the ultrathin copper layer measured using a contact roughness meter is 1.7 μm or less.

In yet another embodiment of the copper foil provided with a carrier according to the present invention, the specular gloss at 60° in an MD direction of the intermediate layer side surface of the ultrathin copper layer/the specular gloss at 60° in a TD direction of the intermediate layer side surface of the ultrathin copper layer is 2.05 or less.

In yet another embodiment of the copper foil provided with a carrier according to the present invention, the average roughness Rz in an MD direction of the intermediate layer side surface of the ultrathin copper layer measured using a contact roughness meter/the average roughness Rz in a TD direction of the intermediate layer side surface of the ultrathin copper layer measured using a contact roughness meter is 0.55 or more.

In yet another embodiment of the copper foil provided with a carrier according to the present invention, the copper foil provided with a carrier has:
  one or more layers selected from the group consisting of a roughened layer, a heat resistant layer, an anti-corrosion layer, a chromate-treated layer, and a silane coupling-treated layer,
  in the case that the copper foil provided with a carrier according to the present invention has an ultrathin copper layer on one side of the carrier, on at least one surface or both surfaces on the ultrathin copper layer side and the carrier side; or
  in the case that the copper foil provided with a carrier according to the present invention has an ultrathin copper layer on both sides of the carrier, on one or both surface(s) on the ultrathin copper layer side.

In yet another embodiment of the copper foil provided with a carrier according to the present invention, the roughened layer is a layer consisting of a simple substance selected from the group consisting of copper, nickel, cobalt, phosphorous, tungsten, arsenic, molybdenum, chromium, and zinc, or an alloy containing one or more thereof.

In yet another embodiment of the copper foil provided with a carrier according to the present invention, the copper foil provided with a carrier includes a resin layer provided above one or more layers selected from the group consisting of the roughened layer, the heat resistant layer, an anti-corrosion layer, a chromate-treated layer, and a silane coupling-treated layer.

In yet another embodiment of the copper foil provided with a carrier according to the present invention, the copper foil provided with a carrier includes a resin layer provided above the ultrathin copper layer.

In yet another embodiment of the copper foil provided with a carrier according to the present invention, the resin layer is a resin for adhesion and/or a resin in a semi-cured state.

The present invention is, in yet another aspect, a laminate fabricated using the copper foil provided with a carrier according to the present invention.

The present invention is, in yet another aspect, is a laminate including the copper foil provided with a carrier according to the present invention and a resin, wherein a part or all of an edge face of the copper foil provided with a carrier is covered with the resin.

The present invention is, in yet another aspect, is a laminate, wherein one copper foil provided with a carrier according to the present invention is laminated from the carrier side or the ultrathin copper layer side on the carrier side or the ultrathin copper layer side of another copper foil provided with a carrier according to the present invention.

The present invention is, in yet another aspect, a printed wiring board fabricated using the copper foil provided with a carrier according to the present invention.

The present invention is, in yet another aspect, an electronic device fabricated using the printed wiring board according to the present invention.

In yet another aspect, the present invention is a method for fabricating a printed wiring board including:
  forming a copper-clad laminate by carrying out
    a step of preparing the copper foil provided with a carrier according to the present invention and an insulating substrate;
    a step of laminating the copper foil provided with a carrier and the insulating substrate; and
    a step of, after the copper foil provided with a carrier and the insulating substrate have been laminated, peeling the carrier of the copper foil provided with a carrier; and
  then forming a circuit by any of a semi-additive method, a subtractive method, a partly additive method, and a modified semi-additive method.

In yet another aspect, the present invention is a method for fabricating a printed wiring board including: a step of forming a circuit on the ultrathin copper layer side surface or the carrier side surface of the copper foil provided with a carrier according to the present invention;
  a step of forming a resin layer on the ultrathin copper layer side surface or the carrier side surface of the copper foil provided with a carrier so that the circuit is buried;
  a step of forming a circuit on the resin layer;
  a step of peeling the carrier or the ultrathin copper layer after forming the circuit on the resin layer; and
  a step of exposing the circuit buried in the resin layer that is formed on the ultrathin copper layer side surface or the carrier side surface by, after the carrier or the ultrathin copper layer has been peeled off, removing the ultrathin copper layer or the carrier.

The present invention is, in yet another aspect, a method for fabricating a printed wiring board including:
  a step of laminating the copper foil provided with a carrier according to the present invention on a resin substrate from the carrier side;
  a step of forming a circuit on the ultrathin copper layer side surface of the copper foil provided with a carrier;
  a step of forming a resin layer on the ultrathin copper layer side surface of the copper foil provided with a carrier so that the circuit is buried;
  a step of forming a circuit on the resin layer;
  a step of peeling the carrier after forming the circuit on the resin layer; and a step of exposing the circuit buried in the resin layer that is formed on the ultrathin copper layer side surface by, after the carrier has been peeled off, removing the ultrathin copper layer.

The present invention is, in yet another aspect, is a method for fabricating a printed wiring board including:

a step of laminating the ultrathin copper layer side surface or the carrier side surface of the copper foil provided with a carrier according to the present invention and a resin substrate;

a step of providing two layers of a resin layer and a circuit at least one time on the ultrathin copper layer side surface or the carrier side surface of the copper foil provided with a carrier opposite to a side with the resin substrate laminated thereon; and a step of, after the two layers of the resin layer and the circuit have been formed, peeling the carrier or the ultrathin copper layer from the copper foil provided with a carrier.

The present invention is, in yet another aspect, is a method for fabricating a printed wiring board including:

a step of laminating the carrier side surface of the copper foil provided with a carrier according to the present invention and a resin substrate;

a step of providing two layers of a resin layer and a circuit at least one time on the ultrathin copper layer side surface of the copper foil provided with a carrier opposite to a side with the resin substrate laminated thereon; and a step of, after the two layers of the resin layer and the circuit have been formed, peeling the carrier from the copper foil provided with a carrier.

The present invention is, in yet another aspect, a method for fabricating a printed wiring board including:

a step of providing two layers of a resin layer and a circuit at least one time on one side or both sides of the laminate according to the present invention; and a step of, after the two layers of the resin layer and the circuit have been formed, peeling the carrier or the ultrathin copper layer from the copper foil provided with a carrier constituting the laminate.

Advantageous Effects of Invention

According to the present invention, a copper foil provided with a carrier can be provided in which the laser hole-opening properties of the ultrathin copper layer are good and which is suitable for producing a high-density integrated circuit substrate.

DESCRIPTION OF EMBODIMENTS

Copper Foil Provided with Carrier

Figure 1A:
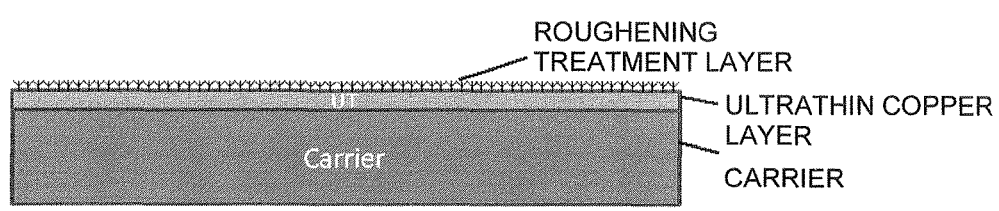
FIGS. 1A to 1C are schematic views of a circuit board cross-section during steps until circuit plating and resist removal according to a specific example of the method for fabricating a printed wiring board using the copper foil provided with a carrier according to the present invention.

The copper foil provided with a carrier of the present invention, has, in order, the carrier, an intermediate layer and an ultrathin copper layer. Methods for using a copper foil provided with a carrier itself are well known to those skilled in the art. For example, the surface of the ultrathin copper layer is pasted on an insulating substrate such as a paper substrate phenolic resin, a paper substrate epoxy resin, a synthetic fiber fabric substrate epoxy resin, a glass cloth-paper composite substrate epoxy resin, a glass cloth-glass non-woven composite substrate epoxy resin, and a glass cloth substrate epoxy resin, a polyester film and a polyimide film followed by heating and pressure-bonding; the carrier is then peeled off; the ultrathin copper layer adhered to the insulating substrate is etched in an intended conductive pattern; and eventually a printed wiring board can be fabricated.

Carrier

The carrier that can be used in the present invention is typically a metal foil or a resin film, and provided in the form of, for example, a copper foil, a copper alloy foil, a nickel foil, a nickel alloy foil, an iron foil, an iron alloy foil, a stainless steel foil, an aluminum foil, an aluminum alloy film, an insulating resin film, a polyimide film, an LCD film, and a fluorine resin film.

The carrier that can be used in the present invention is typically provided in the form of a rolled copper foil or an electrolytic copper foil. Commonly, an electrolytic copper foil is fabricated by electrolytic deposition of copper on a titanium or stainless steel drum from a copper sulfate bath, and a rolled copper foil is fabricated by repeating plastic working and heat treatment with a mill roll. As the material for the copper foil, in addition to high-purity copper, such as tough pitch copper (JIS H3100 alloy number C1100) and oxygen-free copper (JIS H3100 alloy number C1020 or JIS H3510 alloy number C1011), for example, copper alloys can also be used, such as Sn-containing copper, Ag-containing copper, a copper alloy to which Cr, Zr, Mg, or the like has been added, or a Colson copper alloy to which Ni, Si, and the like has been added. Note that, when the term "copper foil" is used singly herein, a copper alloy foil is also included therein.

Although the thickness of the carrier that can be used in the present invention is not especially limited, the carrier may be appropriately adjusted to a suitable thickness in view its role as a carrier, such as, for example, 5 μm or more. However, since production costs increase if the carrier is too thick, generally it is preferred that the thickness is 35 μm or less. Therefore, the thickness of the carrier is typically 8 to 70 μm, more typically 12 to 70 μm, and more typically 18 to 35 μm. From the perspective of reducing the raw material costs, the thickness of the carrier is preferably small. Therefore, the thickness of the carrier is typically 5 μm or more and 35 μm or less, preferably 5 μm or more and 18 μm or less, preferably 5 μm or more and 12 μm or less, preferably 5 μm or more and 11 μm or less, and preferably 5 μm or more and 10 μm or less. In the case that the thickness of the carrier is small, a crease easily generates during conveying of the carrier in a foil. In order to prevent the generation of a crease, for example, it is effective to smooth the conveying rolls in an apparatus for fabricating a copper foil provided with a carrier and to reduce the distance between one conveying roll and the next one. In the case that a copper foil provided with a carrier is used for a burying method (Embedded Process), which is one of methods for fabricating a printed wiring board, it is necessary for the carrier to have a high stiffness. Accordingly, in the case of being used for a burying method, the thickness of the carrier is preferably 18 μm or more and 300 μm or less, preferably 25 μm or more and 150 μm or less, preferably 35 μm or more and 100 μm or less, and even more preferably 35 μm or more and 70 μm or less.

Further, a roughened layer may be provided on the surface opposite to a surface to be provided with the ultrathin copper layer of the carrier. The roughened layer may be provided using a known method, and may be provided using the below-described roughening treatment. Providing a roughened layer on the surface opposite to a surface to be provided with the ultrathin copper layer of the carrier has an advantage that when laminating the carrier on a support, such as a resin substrate, from the surface side having the roughened layer, it is more difficult for the carrier and the resin substrate to peel apart.

An example of fabrication conditions in the case that an electrolytic copper foil is used as a carrier is shown below.
Electrolyte Composition
Copper: 90 to 110 g/L
Sulfuric acid: 90 to 110 g/L
Chlorine: 50 to 100 ppm
Leveling agent 1 (bis(3-sulfopropyl)disulfide): 10 to 30 ppm
Leveling agent 2 (amine compound): 10 to 30 ppm An amine compound represented by the following chemical formula can be used for the above-described amine compound.

Note that the balance of a treatment solution used in electrolysis, a surface treatment, plating, or the like used in the present invention is water unless otherwise noted.

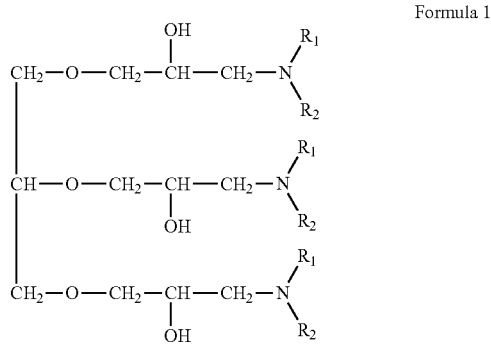

Formula 1 wherein $R_1$ and $R_2$ are selected from the group consisting of a hydroxyalkyl group, an ether group, an aryl group, an aromatic-substituted alkyl group, an unsaturated hydrocarbon group, and an alkyl group.
Fabrication Conditions
Current density: 70 to 100 A/dm$^2$
Electrolyte temperature: 50 to 60° C.
Electrolyte linear speed: 3 to 5 m/sec
Electrolysis time: 0.5 to 10 minutes
Intermediate Layer An intermediate layer is provided on one side or both sides of the carrier. Another layer may also be provided between the carrier and the intermediate layer. The intermediate layer used in the present invention is not especially limited, as long as the configuration of the copper foil provided with a carrier is such that the ultrathin copper layer does not easily peel from the carrier before the lamination step onto an insulating substrate, and such that the ultrathin copper layer can peel from the carrier after the lamination step onto the insulating substrate. For example, the intermediate layer of the copper foil provided with a carrier according to the present invention may include one or two or more selected from the group consisting of Cr, Ni, Co, Fe, Mo, Ti, W, P, Cu, Al, and Zn, alloys thereof, hydrates thereof, oxides thereof, and organic substances. Further, a plurality of intermediate layers may be provided.

In addition, for example, the intermediate layer can be configured from the carrier side from a single metal layer formed from one element selected from the group of elements consisting of Cr, Ni, Co, Fe, Mo, Ti, W, P, Cu, Al, and Zn, or, configured by forming an alloy layer formed from one or two or more elements selected from the group of elements consisting of Cr, Ni, Co, Fe, Mo, Ti, W, P, Cu, Al, and Zn, or a layer containing an organic substance and forming above that layer a single metal layer or an alloy layer of one or two or more elements selected from the group of elements consisting of Cr, Ni, Co, Fe, Mo, Ti, W, P, Cu, Al, and Zn or a layer of a hydrate or an oxide or an organic substance thereof.

If the intermediate layer is provided on just one side, it is preferred to provide an anti-corrosion layer such as a Ni plating layer, on the opposite face of the carrier. In the case that the intermediate layer is provided using a chromate treatment, a zinc chromate treatment, or a plating treatment, it is believed that a part of the metals attached such as chromium and zinc may be in a state of a hydrate or an oxide.

Further, for example, the intermediate layer can be configured by laminating a nickel, a nickel-phosphorus alloy, or a nickel-cobalt alloy, and a chromium, in that order, on the carrier. Since the adhesive strength between nickel and copper is higher than the adhesive strength between chromium and copper, when the ultrathin copper layer is peeled, the peeling occurs at the interface between the ultrathin copper layer and the chromium. Further, the nickel in the intermediate layer can be expected to provide a barrier effect that prevents the diffusion of the copper component from the carrier into the ultrathin copper layer. The amount of nickel deposited in the intermediate layer is preferably 100 μg/dm$^2$ or more and 40,000 μg/dm$^2$ or less, more preferably 100 μg/dm$^2$ or more and 4,000 μg/dm$^2$ or less, more preferably 100 μg/dm$^2$ or more and 2,500 μg/dm$^2$ or less, and more preferably 100 μg/dm$^2$ or more and less than 1,000 μg/dm$^2$. The amount of chromium deposited in the intermediate layer is preferably 5 μg/dm$^2$ or more and 100 μg/dm$^2$ or less. If the intermediate layer is provided on just one side, it is preferred to provide an anti-corrosion layer, such as a Ni plating layer, on the opposite face of the carrier.

The intermediate layer can be provided by performing for a carrier a wet plating such as an electroplating, an electroless plating, and an immersion plating, or a dry plating such as a sputtering, a CVD, and a PVD. In the case that the intermediate layer is provided using a wet plating with a resin film for a carrier, it is necessary to perform a pretreatment such as an activation treatment for subjecting the carrier to a wet plating before formation of the intermediate layer. The above-described pretreatment which can be used may be any treatment as long as it enables to perform a wet plating for a resin film, and known treatments can be used.

Ultrathin Copper Layer

The ultrathin copper layer is provided above the intermediate layer. Another layer may also be provided between the intermediate layer and the ultrathin copper layer. The ultrathin copper layer can be formed through an electroplating utilizing an electrolytic bath of copper sulfate, copper pyrophosphate, copper sulfamate, copper cyanide, or the like, and a copper sulfate bath is preferred because it is used for a common electrolytic copper foil and enables to form a copper foil at a high current density. Although the thickness of the ultrathin copper layer is not especially limited, the ultrathin copper layer is usually thinner than the carrier, and may be, for example, 12 μm or less. The thickness of the ultrathin copper layer is typically 0.01 to 12 μm, more typically 0.05 to 12 μm, more typically 0.1 to 12 μm, more typically 1 to 5 μm, even more typically 1.5 to 5 μm, and even more typically 2 to 5 μm. Further, the ultrathin copper layer may be provided on both sides of the carrier.

Specular Gloss at 60° of Intermediate Layer Side Surface of Ultrathin Copper Layer In the copper foil provided with a carrier according to the present invention in one aspect, the specular gloss at 60° in an MD direction (hereinafter, also referred to as longitudinal direction or rolling direction. MD direction: the direction perpendicular to the direction for conveying a copper foil in an apparatus for fabricating an electrolytic copper foil) of the intermediate layer side surface of the ultrathin copper layer is controlled to be 140 or less. Further, in the copper foil provided with a carrier according to the present invention in another aspect, the specular gloss at 60° in a TD direction (hereinafter, also referred to as width direction or traverse direction. TD direction: the direction for conveying a copper foil in an apparatus for fabricating an electrolytic copper foil) of the intermediate layer side surface of the ultrathin copper layer is controlled to be 65 or less.

A copper foil provided with a carrier is pasted on an insulating substrate followed by heating and pressure-bonding; the carrier is then peeled off; and the ultrathin copper layer adhered to the insulating substrate is etched in an intended conductive pattern to form a circuit. A printed wiring board is produced by making a substrate in a multi-layered structure in this way. Here, in order to increase the integrated circuit density of such a printed wiring board, a laser hole is formed and the inner layer and the outer layer are connected through the hole. At this time, difficulty in opening a laser hole in the ultrathin copper layer is of course problematic and both too large laser hole and too small laser hole cause various problems. Therefore, it is necessary to form a laser hole with a moderate size. As seen from the above, the laser hole-opening properties of the ultrathin copper layer are important properties which significantly influence the design and productivity of an integrated circuit since they are involved in various conditions such as hole diameter precision and laser output. In the present invention, it was discovered that controlling the specular gloss at 60° in an MD direction (rolling direction) of the intermediate layer side surface of the ultrathin copper layer to be 140 or less, or controlling the specular gloss at 60° in a TD direction (traverse direction) of the intermediate layer side surface of the ultrathin copper layer to be 65 or less makes the laser hole-opening properties of the ultrathin copper layer good.

If the specular gloss at 60° in an MD direction of the intermediate layer side surface of the ultrathin copper layer is more than 140, or the specular gloss at 60° in a TD direction of the intermediate layer side surface of the ultrathin copper layer is more than 65, the specular gloss at 60° in an MD direction or a TD direction of the intermediate layer side surface of the ultrathin copper layer is too large and as a result the absorbability to a laser in hole opening processing is made too much, which causes a problem of too a large hole.

The specular gloss at 60° in an MD direction of the intermediate layer side surface of the ultrathin copper layer is preferably 130 or less, more preferably 120 or less, and more preferably 110 or less. Further the lower limit of the specular gloss at 60° in an MD direction of the intermediate layer side surface of the ultrathin copper layer may be, without being particularly limited, 0.1 or more, 0.5 or more, 1.0 or more, 5.0 or more, or 10.0 or more.

The specular gloss at 60° in a TD direction of the intermediate layer side surface of the ultrathin copper layer is preferably 60 or less, more preferably 55 or less, and even more preferably 45 or less. Further, the lower limit of the specular gloss at 60° in a TD direction of the intermediate layer side surface of the ultrathin copper layer may be, without being particularly limited, 0.1 or more, 0.5 or more, 1.0 or more, 5.0 or more, or 10.0 or more.

Ten Point Average Roughness Rz of Intermediate Layer Side Surface of Ultrathin Copper Layer In the copper foil provided with a carrier according to the present invention, the ten point average roughness Rz (JIS B0601 1982) in an MD direction (rolling direction) of the intermediate layer side surface of the ultrathin copper layer measured using a contact roughness meter is preferably 1.5 μm or less. This configuration enables to control the absorbability to a laser in hole opening processing and as a result the laser hole-opening properties of the ultrathin copper layer become better. The ten point average roughness Rz of the intermediate layer side surface of the ultrathin copper layer is more preferably 1.4 μm or less, and even more preferably 1.3 μm or less. Further, the lower limit of the ten point average roughness Rz (JIS B0601 1982) in an MD direction (rolling direction) of the intermediate layer side surface of the ultrathin copper layer may be, without being particularly limited, 0.01 μm or more, 0.05 μm or more, or 0.1 μm or more. If the ten point average roughness Rz (JIS B0601 1982) in an MD direction (rolling direction) of the intermediate layer side surface of the ultrathin copper layer is 0.80 μm, preferably 0.85 μm or more, or preferably 0.90 μm or more, the absorbability to a laser in hole opening processing can be controlled to be better and as a result the laser hole-opening properties of the ultrathin copper layer become better.

In the copper foil provided with a carrier according to the present invention, the ten point average roughness Rz (JIS B0601 1982) in a TD direction (traverse direction) of the intermediate layer side surface of the ultrathin copper layer measured using a contact roughness meter is preferably 1.7 μm or less. This configuration enables to control the absorbability to a laser in hole opening processing and as a result the laser hole-opening properties of the ultrathin copper layer become better. The ten point average roughness Rz of the intermediate layer side surface of the ultrathin copper layer is more preferably 1.6 μm or less, and even more preferably 1.5 μm or less. Further, the lower limit of the ten point average roughness Rz (JIS B0601 1982) in a TD direction (traverse direction) of the intermediate layer side surface of the ultrathin copper layer may be, without being particularly limited, 0.01 μm or more, 0.05 μm or more, or 0.1 μm or more.

Figure 5:
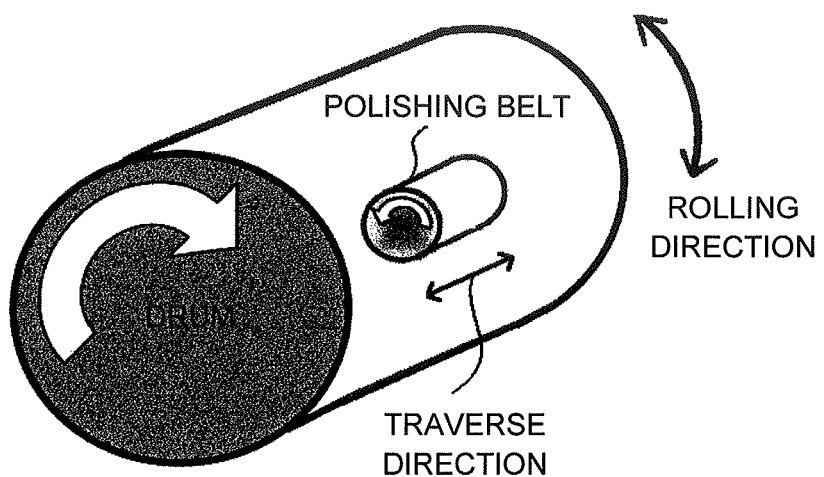
FIG. 5 is a schematic view illustrating a method for polishing with an electrolytic drum.

The above specular glosses at 60° and ten point average roughnesses Rz in an MD direction and a TD direction of the intermediate layer side surface of the ultrathin copper layer in the present invention can be controlled in the following way. That is, on the intermediate layer side surface of a carrier on which an intermediate layer has been formed is formed a carrier with an electrolytic drum the ultrathin copper layer-forming surface of which has been polished by using a predetermined polishing method. In the method for polishing an electrolytic drum, the surface of an electrolytic drum is polished not only in the rolling direction (MD direction) but also in the TD direction. Specifically, as illustrated in FIG. 5, the polishing belt is contacted to polish the electrolytic drum in the rolling direction (MD direction) while rolling the electrolytic drum and simultaneously the polishing belt is moved with oscillation also in the TD direction of the electrolytic drum to thereby polish the electrolytic drum in the TD direction as well. Here, a titanium drum can be used as the electrolytic drum. In addition, as the polishing belt can be used a polishing belt using a silicon carbide abrasive grain, an alumina abrasive grain, or tungsten carbide abrasive grain as the abrasive grain. The particle size of the abrasive grain is preferably a particle size of F 240 to F 1200 or #320 to #4000 defined in JIS R6001 1998. The oscillation width of the polishing belt in the TD direction is 0.01 to 5 mm, the movement of the polishing belt in the traverse direction (stroke: the number of returns of the center of the polishing belt to the same position in the TD direction of the electrolytic drum surface within a certain time) is 50 to 300 returns/min, the moving speed (carriage speed) of the polishing belt in the TD direction is 20 to 100 cm/min, and the rotation speed of the electrolytic drum is 5 to 15 rpm. The width of the polishing belt can be 50 to 300 mm.

By forming a carrier using an electrolytic drum the surface of which has been polished in the MD direction and the TD direction in this way, the specular glosses at 60° and ten point average roughnesses Rz in an MD direction and a TD direction of the intermediate layer side surface of the ultrathin copper layer formed across the intermediate layer on the carrier can be controlled.

Further, the above specular gloss at 60° in an MD direction/the above specular gloss at 60° in a TD direction is preferably 2.05 or less, more preferably 2.00 or less, even more preferably 1.95 or less, and even more preferably 1.90 or less from the viewpoint of absorbing more laser light.

Furthermore, the above ten point average roughness Rz in an MD direction/the above ten point average roughness Rz in a TD direction is preferably 0.55 or more, more preferably 0.60 or more, and even more preferably 0.63 or more from the viewpoint of absorbing more laser light.

Roughening Treatment and Other Surface Treatment

A roughened layer may be provided on the surface of the ultrathin copper layer by performing a roughening treatment, for example, in order to make the close adhesion properties to an insulating substrate good. The roughening treatment can be carried out by forming roughened particles with copper or a copper alloy, for example. The roughening treatment may be a fine treatment. The roughened layer may be a layer consisting of a simple substance selected from the group consisting of copper, nickel, phosphorus, tungsten, arsenic, molybdenum, chromium, iron, vanadium, cobalt, and zinc, an alloy containing one or more thereof, or the like. Alternatively, after forming roughened particles with copper or a copper alloy, a roughening treatment can be carried out in which secondary particles or tertiary particles are further provided using a simple substance of nickel, cobalt, copper, or zinc, an alloy thereof, or the like. Thereafter, a heat resistant layer or an anti-corrosion layer may be formed with a simple substance of nickel, cobalt, copper, or zinc, an alloy thereof, or the like, and further the surface may be subjected to a treatment such as a chromate treatment and a silane coupling treatment. Alternatively, a heat resistant layer or an anti-corrosion layer may be formed with a simple substance and/or an alloy and/or an oxide and/or a nitride and/or a silicide or the like of nickel, cobalt, copper, zinc, tin, molybdenum, tungsten, phosphorus, arsenic, chromium, vanadium, titanium, aluminum, gold, silver, a platinum group element, iron, or tantalum without performing any roughening treatment followed by further subjecting the surface to a treatment such as a chromate treatment and a silane coupling treatment. That is, one or more layers selected from the group consisting of a heat resistant layer, an anti-corrosion layer, a chromate-treated layer, and a silane coupling-treated layer may be formed on the surface of the roughened layer, or one or more layers selected from the group consisting of a heat resistant layer, an anti-corrosion layer, a chromate-treated layer, and a silane coupling-treated layer may be formed on the surface of the ultrathin copper layer. The above-described roughened layer, heat resistant layer, anti-corrosion layer, chromate-treated layer, and silane coupling-treated layer may be each formed in a plurality of layers (e.g., two or more layers or three or more layers).

For example, copper-cobalt-nickel alloy plating as the roughening treatment can be performed by using electrolytic plating so that a ternary alloy layer is formed with the amount deposited of copper, cobalt, and nickel being 15 to 40 mg/dm$^2$, 100 to 3,000 μg/dm$^2$, and 100 to 1,500 μg/dm$^2$, respectively. If the amount of Co deposited is less than 100 μg/dm$^2$, the heat resistance is deteriorated and the etching properties may be worsened. If the amount of Co deposited is more than 3,000 μg/dm$^2$, which is not preferred in the case that the influence of magnetic properties has to be considered, an etching spot may be generated or the acid resistance and the chemical resistance may be deteriorated. If the amount of Ni deposited is less than 100 μg/dm$^2$, the heat resistance may be worsened. On the other hand, if the amount of Ni deposited is more than 1,500 μg/dm$^2$, the amount of etching residue may be increased. The amount of Co deposited is preferably 1,000 to 2,500 μg/dm$^2$, and the amount of nickel deposited is preferably 500 to 1,200 μg/dm$^2$. Here, an etching spot means that, in etching with copper chloride, Co is left without being dissolved, and etching residue means that, in alkali-etching with ammonium chloride, Ni is left without being dissolved.

An example of a common bath and plating conditions for forming such a ternary copper-cobalt-nickel alloy plating are as follows.

Plating bath composition: Cu 10 to 20 g/L, Co 1 to 10 g/L, Ni 1 to 10 g/L
pH: 1 to 4
Temperature: 30 to 50° C.
Current density $D_k$: 20 to 30 A/dm$^2$
Plating time: 1 to 5 seconds The chromate-treated layer refers to a layer treated with a solution containing chromic anhydride, chromic acid, dichromic acid, a chromate, or a dichromate. The chromate-treated layer may contain an element such as Co, Fe, Ni, Mo, Zn, Ta, Cu, Al, P, W, Sn, As, and Ti (any form is available such as a metal, an alloy, an oxide, a nitride, and a sulfide). Specific examples of the chromate-treated layer include a chromate-treated layer which has been treated with chromic anhydride or an aqueous solution of potassium dichromate and a chromate-treated layer which has been treated with a treatment solution containing chromic anhydride or potassium dichromate and zinc.

The silane coupling-treated layer may be formed using a known silane coupling agent, and may be formed using a silane coupling agent such as an epoxy silane, an amino silane, a methacryloxy silane, a mercapto silane, a vinyl silane, an imidazole silane, and a triazine silane or the like. Two or more of these silane coupling agents may be used in a mixture. Among them, the silane coupling-treated layer is preferably formed using an amino silane coupling agent or an epoxy silane coupling agent.

In addition, the surface of the ultrathin copper layer, the roughened layer, the heat resistant layer, the anti-corrosion layer, the silane coupling-treated layer, or the chromate-treated layer can be subjected to a surface treatment described in International Publication No. WO 2008/053878, Japanese Patent Laid-Open No. 2008-111169, Japanese Patent No. 5024930, International Publication No. WO 2006/028207, Japanese Patent No. 4828427, International Publication No. WO 2006/134868, Japanese Patent No. 5046927, International Publication No. WO 2007/105635, Japanese Patent No. 5180815, or Japanese Patent Laid-Open No. 2013-19056.

In this way, a copper foil provided with a carrier is fabricated including a carrier, an intermediate layer laminated on the carrier, and an ultrathin copper layer laminated on the intermediate layer. Methods for using a copper foil provided with a carrier itself are well known to those skilled in the art. For example, the surface of the ultrathin copper layer is pasted on an insulating substrate such as a paper substrate phenolic resin, a paper substrate epoxy resin, a synthetic fiber fabric substrate epoxy resin, a glass cloth-paper composite substrate epoxy resin, a glass cloth-glass non-woven composite substrate epoxy resin, and a glass cloth substrate epoxy resin, a polyester film and a polyimide film followed by heating and pressure-bonding; the carrier is then peeled off to make a copper-clad laminate; the ultrathin copper layer adhered to the insulating substrate is etched in an intended conductive pattern; and eventually a printed wiring board can be fabricated.

Further, the copper foil provided with a carrier including a carrier, an intermediate layer laminated on the carrier, and an ultrathin copper layer laminated on the intermediate layer may be provided with a roughened layer above the ultrathin copper layer, and may be provided with one or more layers selected from the group consisting of a heat resistant layer, an anti-corrosion layer, a chromate-treated layer, and a silane coupling-treated layer above the roughened layer.

Furthermore, the copper foil provided with a carrier may be provided with a roughened layer above the ultrathin copper layer, and may be provided with a heat resistant layer or anti-corrosion layer above the roughened layer, and may be provided with a chromate-treated layer above the heat resistant layer or anti-corrosion layer, and may be provided with a silane coupling-treated layer above the chromate-treated layer.

Alternatively, the copper foil provided with a carrier may be provided with a resin layer above the ultrathin copper layer, or above the roughened layer, or above the heat resistant layer, anti-corrosion layer, or a chromate-treated layer, or a silane coupling-treated layer. The resin layer may be an insulating resin layer.

The above-described resin layer may be an adhesive, and may also be an insulating resin layer in a semi-cured state (B stage state) for adhesion. This semi-cured state (B stage state) includes states in which there is no stickiness feeling even if the surface is touched with a finger, the insulating resin layer can be stacked and stored, and a curing reaction occurs when further subjected to a heating treatment.

Further, the above-described resin layer may include a thermosetting resin, or may be a thermoplastic resin. In addition, the above-described resin layer may include a thermoplastic resin. The type of the above-described resin layer is not especially limited. Examples of preferred resins can include one or more selected from the group consisting of epoxy resins, polyimide resins, polyfunctional cyanate compounds, maleimide compounds, polymaleimide compounds, maleimide resins, aromatic maleimide resins, polyvinyl acetal resins, urethane resins, polyether sulfone (also called polyether sulphone), polyether sulfone (also called polyether sulphone) resins, aromatic polyamide resins, aromatic polyamide resin polymers, rubber resins, polyamines, aromatic polyamines, polyamide-imide resins, rubber-modified epoxy resins, phenoxy resins, carboxyl group-modified acrylonitrile-butadiene resins, polyphenylene oxide, bismaleimide triazine resins, thermosetting polyphenylene oxide resins, cyanate ester resins, carboxylic acid anhydrides, polybasic carboxylic acid anhydrides, linear polymers having a crosslinkable functional group, polyphenylene ether resins, 2,2-bis(4-cyanatophenyl)propane, phosphorus-containing phenol compounds, manganese naphthenate, 2,2-bis (4-glycidylphenyl)propane, polyphenylene ether-cyanate resins, siloxane-modified polyamide-imide resins, cyano ester resins, phosphazene resins, rubber-modified polyamide-imide resins, isoprene, hydrogenated polybutadiene, polyvinyl butyral, phenoxy, high-molecular-weight epoxys, aromatic polyamides, fluororesins, bisphenol, polyimide block copolymer resins, and cyano ester resins.

In addition, the above-described epoxy resin can be used without any particular problem as long as it has two or more epoxy groups in the molecule and can be used in electrical/electronic material applications. Moreover, an epoxy resin epoxied using a compound having two or more glycidyl groups in the molecule is preferred. Further examples of epoxy resins that can be used include one or a mixture of two or more selected from the group consisting of bisphenol A type epoxy resins, bisphenol F type epoxy resins, bisphenol S type epoxy resins, bisphenol AD type epoxy resins, novolak type epoxy resins, cresol novolak type epoxy resins, alicyclic epoxy resins, brominated epoxy resins, phenol novolak type epoxy resins, naphthalene type epoxy resins, brominated bisphenol A type epoxy resins, ortho-cresol novolak type epoxy resins, rubber-modified bisphenol A type epoxy resins, glycidyl amine compounds such as glycidyl amine type epoxy resins, triglycidyl isocyanurate, and N,N-diglycidyl aniline, glycidyl ester compounds such as diglycidyl tetrahydrophthalate, phosphorus-containing epoxy resins, biphenyl type epoxy resins, biphenyl novolak type epoxy resins, tris(hydroxyphenyl)methane type epoxy resins, and tetraphenylethane type epoxy resins. Also, a hydrogenated product or a halide of the above-described epoxy resins may be used.

A known phosphorus-containing epoxy resin can be used for the above-described phosphorus-containing epoxy resin. Further, it is preferred that the above-described phosphorus-containing epoxy resin is an epoxy resin obtained as a derivative from, for example, 9,10-dihydro-9-oxa-10-phosphaphenanthrene-10-oxide that includes two or more epoxy groups in the molecule.

This resin layer may include known resins, resin curing agents, compounds, curing accelerators, dielectrics (any dielectric may be used such as a dielectric containing an inorganic compound and/or an organic compound and a dielectric containing a metal oxide), reaction catalysts, cross-linking agents, polymers, prepregs, skeletal materials, and the like. Further, the resin layer may be formed using the substances (resins, resin curing agents, compounds, curing accelerators, dielectrics, reaction catalysts, cross-linking agents, polymers, prepregs, skeletal materials, and the like) and/or resin layer formation method and formation apparatus described in International Publication No. WO 2008/004399, International Publication No. WO 2008/053878, International Publication No. WO 2009/084533, Japanese Patent Laid-Open No. 1999-5828, Japanese Patent Laid-Open No. 1999-140281, Japanese Patent No. 3184485, International Publication No. WO 97/02728, Japanese Patent No. 3676375, Japanese Patent Laid-Open No. 2000-43188, Japanese Patent No. 3612594, Japanese Patent Laid-Open No. 2002-179772, Japanese Patent Laid-Open No. 2002-359444, Japanese Patent Laid-Open No. 2003-304068, Japanese Patent No. 3992225, Japanese Patent Laid-Open No. 2003-249739, Japanese Patent No. 4136509, Japanese Patent Laid-Open No. 2004-82687, Japanese Patent No. 4025177, Japanese Patent Laid-Open No. 2004-349654, Japanese Patent No. 4286060, Japanese Patent Laid-Open No. 2005-262506, Japanese Patent No. 4570070, Japanese Patent Laid-Open No. 2005-53218, Japanese Patent No. 3949676, Japanese Patent No. 4178415, International Publication No. WO 2004/005588, Japanese Patent Laid-Open No. 2006-257153, Japanese Patent Laid-Open No. 2007-326923, Japanese Patent Laid-Open No. 2008-111169, Japanese Patent No. 5024930, International Publication No. WO 2006/028207, Japanese Patent No. 4828427, Japanese Patent Laid-Open No. 2009-67029, International Publication No. WO 2006/134868, Japanese Patent No. 5046927, Japanese Patent Laid-Open No. 2009-173017, International Publication No. WO 2007/105635, Japanese Patent No. 5180815, International Publication No. WO 2008/114858, International Publication No. WO 2009/008471, Japanese Patent Laid-Open No. 2011-14727, International Publication No. WO 2009/001850, International Publication No. WO 2009/145179, International Publication No. WO 2011/068157, Japanese Patent Laid-Open No. 2013-19056.

The above-described resin is obtained in a B stage state by, for example, dissolving in a solvent such as methyl ethyl ketone (MEK) and toluene to produce a resin solution, coating the resin solution on the ultrathin copper layer, or the heat resistant layer, anti-corrosion layer, or the chromate film layer, or the silane coupling-treated layer by a roll coater method, for example, and then heating and drying as necessary to remove the solvent. The drying can be carried out using, for example, a hot air drying furnace, at a drying temperature of 100 to 250° C., and preferably 130 to 200° C.

The copper foil provided with a carrier including the above-described resin layer (copper foil provided with a carrier provided with a resin) is used in a mode for forming a predetermined wiring pattern on the ultrathin copper layer side surface by stacking the resin layer on the base material, then heating and pressure-bonding the whole stack to thermally cure the resin layer, and then peeling the carrier to expose the ultrathin copper layer to the surface (naturally the exposed portion is the surface on the intermediate layer side of the ultrathin copper layer).

If this copper foil provided with a carrier provided with a resin is used, the number of sheets of prepreg material used when fabricating a multilayer printed wiring board can be reduced. Moreover, the thickness of the resin layer can be set to a thickness that ensures interlayer insulation, and a copper-clad laminate can be fabricated even without using a prepreg material at all. Further, at this point, the smoothness of the surface can be further improved by applying an insulating resin as an undercoat on the surface of the base material.

Further, not using a prepreg material has the economic advantages that the costs of the prepreg material can be saved, and the lamination step can be simplified. Moreover, there is also the advantage that the thickness of the multilayer printed wiring board to be fabricated is thinner by the thickness amount of the prepreg material, so that a very thin multilayer printed wiring board in which the thickness of one layer is 100 µm or less can be fabricated.

It is preferred that the thickness of this resin layer is 0.1 to 80 µm. If the thickness of the resin layer is thinner than 0.1 µm, the adhesive strength can deteriorate, and it can become difficult to ensure interlayer insulation between an inner layer material and the circuit when this copper foil provided with a carrier provided with a resin is laminated on a base material including an inner layer material without arranging a prepreg material therebetween.

On the other hand, if the resin layer thickness is thicker than 80 µm, it can be difficult to form a resin layer with a target thickness in one coating step, so that extra material costs and steps are required, which is economically disadvantageous. Further, since the resin layer formed is inferior in flexibility, a crack or the like is likely to be generated in handling and an excessive resin flow may occur in heating and pressure-bonding to the inner layer material resulting in difficulty in smooth lamination.

In addition, regarding another product form of this copper foil provided with a carrier provided with a resin, it is also possible to cover the top of the ultrathin copper layer, or the heat resistant layer, the anti-corrosion layer, or the chromate-treated layer, or the silane coupling-treated layer with a resin layer, which is then semi-cured, and thereafter peel off the carrier to fabricate a copper foil provided with a resin without a carrier.

Further, a printed circuit board is completed by mounting electronic components on the printed wiring board. In the present invention, a "printed wiring board" includes a printed wiring board with electronic components mounted thereon in this way and a printed circuit board and a printed substrate.

Furthermore, an electronic device may be produced using the printed wiring board, an electronic device may be produced using the printed circuit board with electronic components mounted thereon, and an electronic device may be produced using the printed substrate with electronic components mounted thereon. Several examples of the fabrication steps of a printed wiring board using the copper foil provided with a carrier according to the present invention will now be described below.

An embodiment of the method for fabricating a printed wiring board according to the present invention includes forming a copper-clad laminate by carrying out a step of preparing the copper foil provided with a carrier according to the present invention and an insulating substrate, a step of laminating the copper foil provided with a carrier and the insulating substrate, and a step of, after the copper foil provided with a carrier and the insulating substrate have been laminated in such a manner that the ultrathin copper layer side of the copper foil faces the insulating substrate, peeling the carrier of the copper foil provided with a carrier, and then forming a circuit by any of a semi-additive method, a modified semi-additive method, a partly additive method, and a subtractive method. The insulating substrate can also be formed between the inner layer circuits.

In the present invention, semi-additive method refers to a method for forming a pattern by performing thin electroless plating on an insulating substrate or a copper foil seed layer, and then forming a conductive pattern using electrolytic plating and etching.

Therefore, an embodiment of a method for fabricating a printed wiring board according to the present invention using a semi-additive method includes:
- a step of preparing the copper foil provided with a carrier according to the present invention and an insulating substrate;
- a step of laminating the copper foil provided with a carrier and the insulating substrate;
- a step of, after the copper foil provided with a carrier and the insulating substrate have been laminated, peeling the carrier of the copper foil provided with a carrier;
- a step of removing all of an ultrathin copper layer exposed by the peeling of the carrier by a method such as plasma or etching using a corrosive solution such as an acid;
- a step of providing a through-hole and/or a blind via on a resin exposed by removal of the ultrathin copper layer by etching;
- a step of performing a desmearing treatment on a region including the through-hole and/or blind via;
- a step of providing an electroless plating layer for a region including the resin and the through-hole and/or blind via;
- a step of providing a plating resist on the electroless plating layer;
- a step of exposing the plating resist and then removing the plating resist in a region where a circuit is formed;
- a step of providing an electrolytic plating layer on the region where the circuit is formed from which the plating resist has been removed;
- a step of removing the plating resist; and
- a step of removing the electroless plating layer in regions other than where the circuit is formed by flash etching and the like.

Another embodiment of a method for fabricating a printed wiring board according to the present invention using a semi-additive method includes:
- a step of preparing the copper foil provided with a carrier according to the present invention and an insulating substrate;
- a step of laminating the copper foil provided with a carrier and the insulating substrate;
- a step of, after the copper foil provided with a carrier and the insulating substrate have been laminated, peeling the carrier of the copper foil provided with a carrier;
- a step of providing a through-hole and/or a blind via on an ultrathin copper layer exposed by the peeling of the carrier and the insulating rein substrate;
- a step of performing a desmearing treatment on a region including the through-hole and/or blind via;
- a step of removing all of the ultrathin copper layer exposed by the peeling of the carrier by a method such as etching or plasma using a corrosive solution such as an acid;
- a step of providing an electroless plating layer for the region including the resin exposed by removal of the ultrathin copper layer by etching or the like and the through-hole and/or blind via;
- a step of providing a plating resist on the electroless plating layer;
- a step of exposing the plating resist and then removing the plating resist in a region where a circuit is formed;
- a step of providing an electrolytic plating layer on the region where the circuit is formed from which the plating resist has been removed;
- a step of removing the plating resist; and
- a step of removing the electroless plating layer in regions other than where the circuit is formed by flash etching and the like.

Another embodiment of a method for fabricating a printed wiring board according to the present invention using a semi-additive method includes:
- a step of preparing the copper foil provided with a carrier according to the present invention and an insulating substrate;
- a step of laminating the copper foil provided with a carrier and the insulating substrate;
- a step of, after the copper foil provided with a carrier and the insulating substrate have been laminated, peeling the carrier of the copper foil provided with a carrier;
- a step of removing all of the ultrathin copper layer exposed by the peeling of the carrier by a method such as etching or plasma using a corrosive solution such as an acid;
- a step of providing an electroless plating layer for the region including the resin exposed by removal of the ultrathin copper layer by etching or the like and the through-hole and/or blind via;
- a step of providing a plating resist on the electroless plating layer;
- a step of exposing the plating resist and then removing the plating resist in a region where a circuit is formed;
- a step of providing an electrolytic plating layer on the region where the circuit is formed from which the plating resist has been removed;
- a step of removing the plating resist; and
- a step of removing the electroless plating layer in regions other than where the circuit is formed by flash etching and the like.

Another embodiment of a method for fabricating a printed wiring board according to the present invention using a semi-additive method includes:
- a step of preparing the copper foil provided with a carrier according to the present invention and an insulating substrate;
- a step of laminating the copper foil provided with a carrier and the insulating substrate;
- a step of, after the copper foil provided with a carrier and the insulating substrate have been laminated, peeling the carrier of the copper foil provided with a carrier;
- a step of removing all of the ultrathin copper layer exposed by the peeling of the carrier by a method such as etching or plasma using a corrosive solution such as an acid;
- a step of providing an electroless plating layer for a surface of the resin exposed by removal of the ultrathin copper layer by etching;
- a step of providing a plating resist on the electroless plating layer;
- a step of exposing the plating resist and then removing the plating resist in a region where a circuit is formed;

a step of providing an electrolytic plating layer on the region where the circuit is formed from which the plating resist has been removed;

a step of removing the plating resist; and a step of removing the electroless plating layer and ultrathin copper layer in regions other than where the circuit is formed by flash etching and the like.

In the present invention, modified semi-additive method refers to a method for forming a circuit on an insulating layer by laminating a metal foil on an insulating layer, protecting a non-circuit formed portion with a plating resist, performing copper thickening of a circuit formed portion by electrolytic plating, then removing the resist, and removing the metal foil at portions other than the circuit formed portion by (flash) etching.

Therefore, an embodiment of a method for fabricating a printed wiring board according to the present invention using a modified semi-additive method includes:

a step of preparing the copper foil provided with a carrier according to the present invention and an insulating substrate;

a step of laminating the copper foil provided with a carrier and the insulating substrate;

a step of, after the copper foil provided with a carrier and the insulating substrate have been laminated, peeling the carrier of the copper foil provided with a carrier;

a step of providing a through-hole and/or a blind via on an ultrathin copper layer and the insulating substrate exposed by the peeling of the carrier;

a step of performing a desmearing treatment on a region including the through-hole and/or blind via;

a step of providing an electroless plating layer for the region including the through-hole and/or blind via;

a step of providing a plating resist on an ultrathin copper layer surface exposed by the peeling of the carrier;

a step of, after providing the plating resist, forming a circuit by electrolytic plating;

a step of removing the plating resist; and a step of removing the ultrathin copper layer exposed by the removal of the plating resist.

Another embodiment of a method for fabricating a printed wiring board according to the present invention using a modified semi-additive method includes:

a step of preparing the copper foil provided with a carrier according to the present invention and an insulating substrate;

a step of laminating the copper foil provided with a carrier and the insulating substrate;

a step of, after the copper foil provided with a carrier and the insulating substrate have been laminated, peeling the carrier of the copper foil provided with a carrier;

a step of providing a plating resist on an ultrathin copper layer exposed by the peeling of the carrier;

a step of exposing the plating resist and then removing the plating resist in a region where a circuit is formed;

a step of providing an electrolytic plating layer on the region where the circuit is formed from which the plating resist has been removed;

a step of removing the plating resist; and a step of removing the electroless plating layer and ultrathin copper layer in regions other than where the circuit is formed by flash etching and the like.

In the present invention, partly additive method refers to a method for fabricating a printed wiring board by providing a catalyst core on a substrate that is provided with a conductive layer and in which holes for through-holes and via holes have optionally been opened, forming a conductive circuit by etching, optionally providing a solder resist or a plating resist, and then performing thickening on the conductive circuit by an electroless plating treatment on the through-holes, via holes, and the like.

Therefore, an embodiment of a method for fabricating a printed wiring board according to the present invention using a partly additive method includes:

a step of preparing the copper foil provided with a carrier according to the present invention and an insulating substrate;

a step of laminating the copper foil provided with a carrier and the insulating substrate;

a step of, after the copper foil provided with a carrier and the insulating substrate have been laminated, peeling the carrier of the copper foil provided with a carrier;

a step of providing a through-hole and/or a blind via on an ultrathin copper layer and the insulating substrate exposed by the peeling of the carrier;

a step of performing a desmearing treatment on a region including the through-hole and/or blind via;

a step of providing a catalyst core for the region including the through-hole and/or blind via;

a step of providing an etching resist on an ultrathin copper layer surface exposed by the peeling of the carrier;

a step of exposing the etching resist to form a circuit pattern;

a step of forming a circuit by removing the ultrathin copper layer and the catalyst core by a method such as plasma or etching using a corrosive solution such as an acid;

a step of removing the etching resist;

a step of providing a solder resist or a plating resist on the insulating substrate surface exposed by removing the ultrathin copper layer and the catalyst core by a method such as plasma or etching using a corrosive solution such as an acid; and a step of providing an electroless plating layer in regions where the solder resist or the plating resist is not provided.

In the present invention, subtractive method refers to a method for forming a conductive pattern by selectively removing an unnecessary portion of copper foil on a copper-clad laminate by etching and the like.

Therefore, an embodiment of a method for fabricating a printed wiring board according to the present invention using a subtractive method includes:

a step of preparing the copper foil provided with a carrier according to the present invention and an insulating substrate;

a step of laminating the copper foil provided with a carrier and the insulating substrate;

a step of, after the copper foil provided with a carrier and the insulating substrate have been laminated, peeling the carrier of the copper foil provided with a carrier;

a step of providing a through-hole and/or a blind via on an ultrathin copper layer and the insulating substrate exposed by the peeling of the carrier;

a step of performing a desmearing treatment on a region including the through-hole and/or blind via;

a step of providing an electroless plating layer for the region including the through-hole and/or blind via;

a step of providing an electrolytic plating layer on a surface of the electroless plating layer;

a step of providing an etching resist on a surface of the electrolytic plating layer and/or the ultrathin copper layer;

a step of exposing the etching resist to form a circuit pattern;

a step of forming a circuit by removing the ultrathin copper layer, the electroless plating layer, and the electrolytic plating layer by a method such as plasma or etching using a corrosive solution such as an acid; and a step of removing the etching resist.

Another embodiment of a method for fabricating a printed wiring board according to the present invention using a subtractive method includes:

a step of preparing the copper foil provided with a carrier according to the present invention and an insulating substrate;

a step of laminating the copper foil provided with a carrier and the insulating substrate;

a step of, after the copper foil provided with a carrier and the insulating substrate have been laminated, peeling the carrier of the copper foil provided with a carrier;

a step of providing a through-hole and/or a blind via on an ultrathin copper layer and the insulating substrate exposed by the peeling of the carrier;

a step of performing a desmearing treatment on a region including the through-hole and/or blind via;

a step of providing an electroless plating layer for the region including the through-hole and/or blind via;

a step of forming a mask on a surface of the electroless plating layer;

a step of providing an electrolytic plating layer on a surface of the electroless plating layer on which the mask is not formed;

a step of providing an etching resist on a surface of the electrolytic plating layer and/or the ultrathin copper layer;

a step of exposing the etching resist to form a circuit pattern;

a step of forming a circuit by removing the ultrathin copper layer and the electroless plating layer by a method such as plasma or etching using a corrosive solution such as an acid; and a step of removing the etching resist.

The step of providing a through-hole and/or a blind via and the subsequent desmearing step do not have to be carried out.

Here, specific examples of the method for fabricating a printed wiring board using the copper foil provided with a carrier according to the present invention will now be described with reference to the drawings. Further, although a copper foil provided with a carrier having an ultrathin copper layer on which a roughened layer has been formed is described here as an example, the present invention is not limited to this. The below-described methods for fabricating a printed wiring board can be carried out in the same manner as using a copper foil provided with a carrier having an ultrathin copper layer on which a roughened layer is not formed.

First, as illustrated in FIG. 1A, a copper foil provided with a carrier (first layer) having an ultrathin copper layer on which a roughened layer has been formed on the surface is prepared.

Figure 1B:
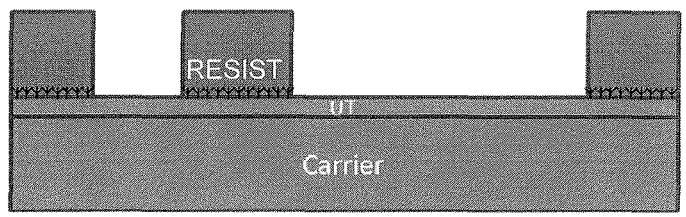

Next, as illustrated in FIG. 1B, a resist is coated on the roughened layer of the ultrathin copper layer, exposure and development is carried out, and the resist is etched into a predetermined shape.

Figure 1C:
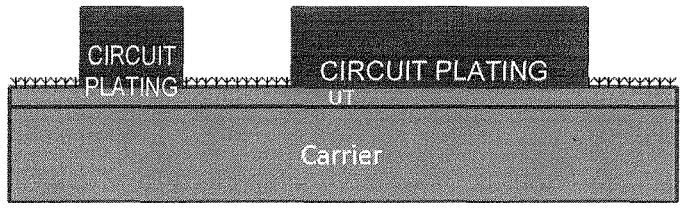

Next, as illustrated in FIG. 1C, a plating for a circuit is formed, and then the circuit plating is formed in a predetermined shape by removing the resist.

Figure 2D:
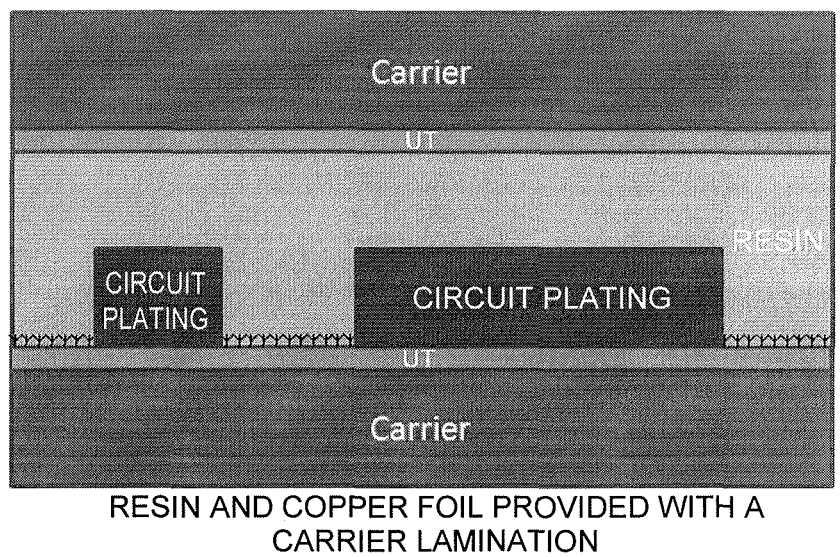
FIGS. 2D to 2F are schematic views of a circuit board cross-section during steps from lamination of a resin and a second layer of a copper foil provided with a carrier until laser hole opening according to a specific example of the method for fabricating a printed wiring board using the copper foil provided with a carrier according to the present invention.

Next, as illustrated in FIG. 2D, a resin layer is laminated by providing an embedded resin on the ultrathin copper layer so as to cover the circuit plating (so as to bury the circuit plating), and then a separate copper foil provided with a carrier (second layer) is adhered from the ultrathin copper layer side.

Figure 2E:
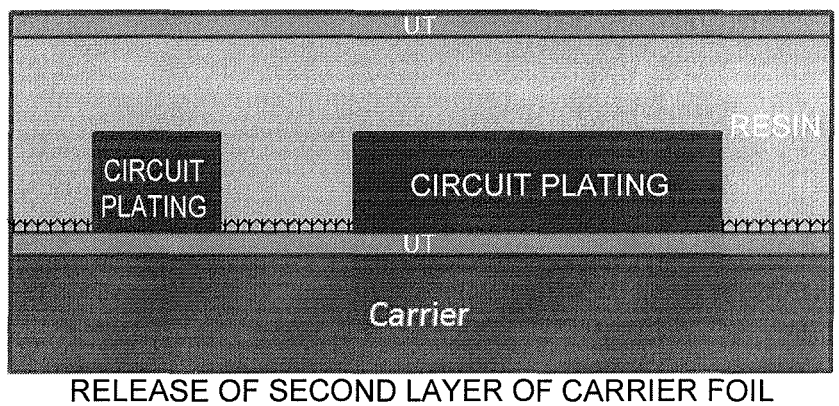

Next, as illustrated in FIG. 2E, the carrier is peeled from the second layer of the copper foil provided with a carrier.

Figure 2F:
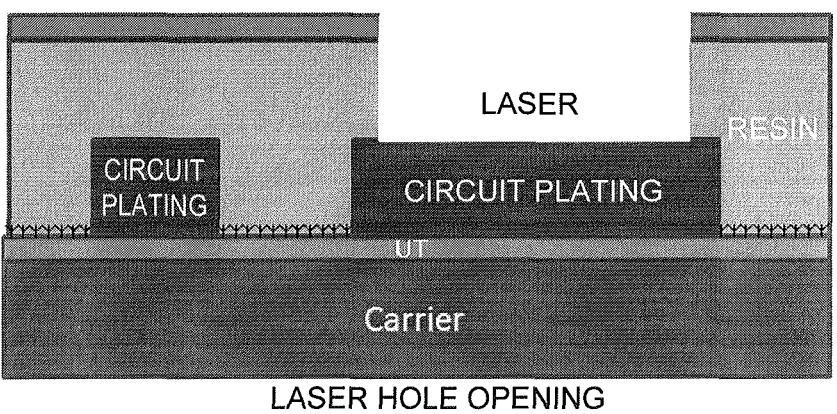

Next, as illustrated in FIG. 2F, laser hole opening is performed on a predetermined position of the resin layer, and the circuit plating is exposed to form a blind via.

Figure 3G:
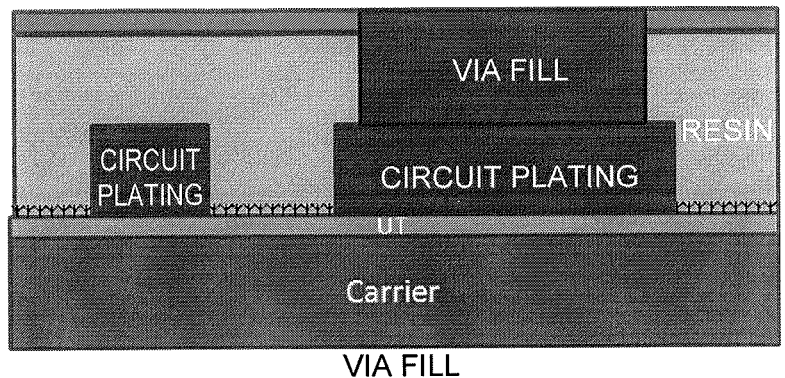
FIGS. 3G to 3I are schematic views of a circuit board cross-section during steps from via fill formation until peeling of the first carrier layer according to a specific example of the method for fabricating a printed wiring board using the copper foil provided with a carrier according to the present invention.

Next, as illustrated in FIG. 3G, copper is embedded in the blind via to form a via fill.

Figure 3H:
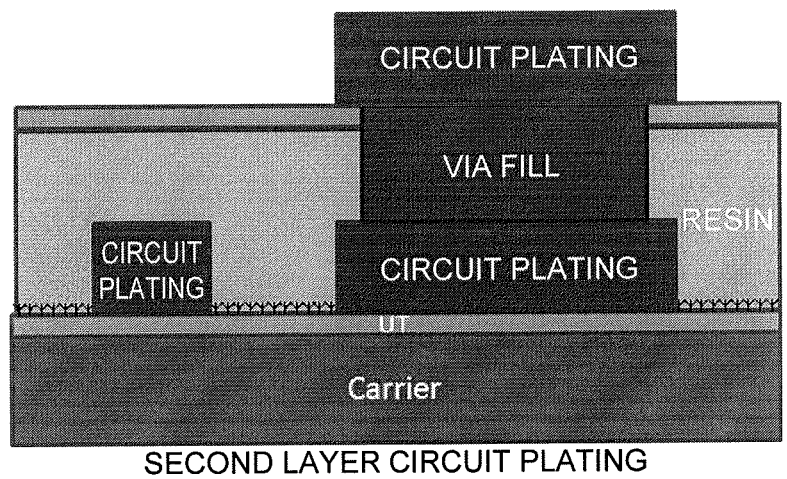

Next, as illustrated in FIG. 3H, a circuit plating is formed as illustrated in the above-described FIGS. 1-B and 1-C on the via fill.

Figure 3I:
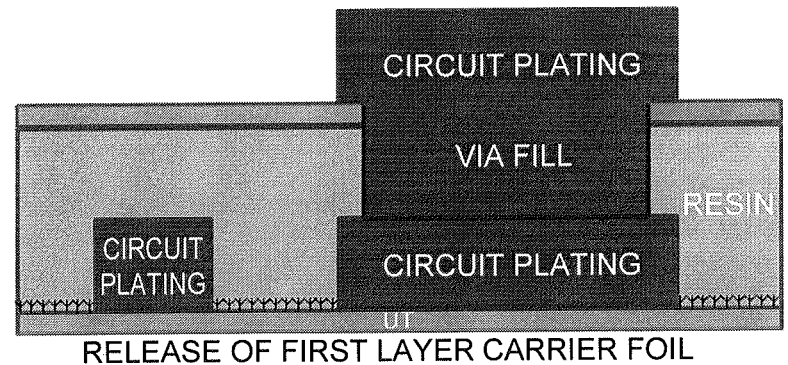

Next, as illustrated in FIG. 3I, the carrier is peeled from the first layer of the copper foil provided with a carrier.

Figure 4J:
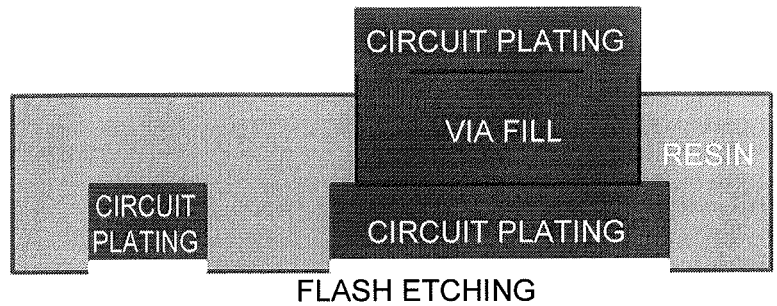
FIGS. 4J to 4K are schematic views of a circuit board cross-section during steps from flash etching until bump and copper pillar formation according to a specific example of the method for fabricating a printed wiring board using the copper foil provided with a carrier according to the present invention.

Next, as illustrated in FIG. 4J, the ultrathin copper layer on both surfaces is removed by flash etching to expose the surface of the circuit plating in the resin layer.

Figure 4K:
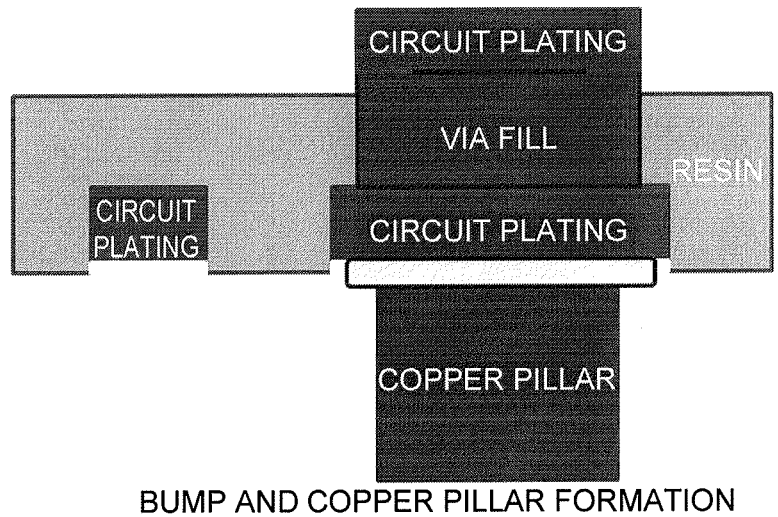

Next, as illustrated in FIG. 4K, a bump is formed on the circuit plating in the resin layer, and a copper pillar is formed on that solder. In this manner, a printed wiring board using the copper foil provided with a carrier according to the present invention is produced.

Note that, in the above-described methods for fabricating a printed wiring board, replacing an "ultrathin copper layer" with a carrier and replacing a "carrier" with an ultrathin copper layer, it is also possible to fabricate a printed wiring board by forming a circuit on the surface on the carrier side of a copper foil provided with a carrier and then burying the circuit in a resin.

For the above-described separate copper foil provided with a carrier (second layer), the copper foil provided with a carrier according to the present invention can be used, a conventional copper foil provided with a carrier may be used, or a normal copper foil may be used. Further, a circuit may be formed in one layer or a plurality of layers on the circuit of the second layer illustrated in FIG. 3H. These circuits can be formed by any of a semi-additive method, a subtractive method, a partly additive method, and a modified semi-additive method.

According to such a printed wiring board fabrication method, since the circuit plating is buried in the resin layer, during removal of the ultrathin copper layer by flash etching like that illustrated in FIG. 4J, for example, the circuit plating is protected by the resin layer, so that the shape of the circuit plating is retained, which facilitates formation of a fine circuit. In addition, since the circuit plating is protected by the resin layer, migration resistance is improved, and circuit wiring conduction can be properly suppressed. Consequently, the formation of a fine circuit is easy. Still further, when the ultrathin copper layer has been removed by flash etching as illustrated in FIGS. 4J and 4K, since the exposed face of the circuit plating has a shape that is recessed from the resin layer, the bumps tend to be formed on that circuit plating and copper pillars tend to be formed above the bumps even more easily, so that production efficiency is improved.

Moreover, a known resin and prepreg can be used for the buried resin. For example, a BT (bismaleimide triazine) resin, a glass cloth prepreg impregnated with a BT resin, an ABF film or ABF manufactured by Ajinomoto Fine-Techno Co., Inc., can be used. Further, the resin layer and/or resin and/or prepreg described in the present specification can be used for the above-described buried resin.

In addition, the above-described copper foil provided with a carrier used for the first layer may have a substrate or a resin layer on the surface of the copper foil provided with a carrier. By having such a substrate or resin layer, the copper foil provided with a carrier used for the first layer is supported, so that wrinkles are less likely to form. Consequently, there is the advantage that productivity is improved. Moreover, any substrate or resin layer may be used for this substrate or resin layer, as long as the substrate or resin layer has an effect of supporting the above-described copper foil provided with a carrier used for the first layer. For example, the carrier, the prepreg, and the resin layer described in the specification of the present application, or a known carrier, prepreg, resin layer, metal sheet, metal foil, sheet of an inorganic compound, foil of an inorganic compound, sheet of an organic compound, or foil of an organic compound can be used as the above-described substrate or resin layer.

Further, the method for fabricating a printed wiring board according to the present invention may be a method for fabricating a printed wiring board including: a step of laminating the ultrathin copper layer side surface or the carrier side surface of the copper foil provided with a carrier according to the present invention and a resin substrate; a step of providing two layers of a resin layer and a circuit at least one time on the surface of the copper foil provided with a carrier opposite to the ultrathin copper layer side surface or the carrier side surface with the resin substrate laminated thereon; and a step of, after the two layers of the resin layer and the circuit have been formed, peeling the carrier or the ultrathin copper layer from the copper foil provided with a carrier (coreless method). In a specific example of the coreless method, first, the ultrathin copper layer side surface or the carrier side surface of the copper foil provided with a carrier according to the present invention and a resin substrate are laminated to fabricate a laminate. Subsequently, a resin layer is formed on the surface of the copper foil provided with a carrier opposite to the ultrathin copper layer side surface or the carrier side surface with the resin substrate laminated thereon. A separate copper foil provided with a carrier may be laminated from the carrier side or the ultrathin copper layer side on the resin layer formed on the carrier side surface or the ultrathin copper layer side surface. Further, a laminate having a configuration in which a copper foil provided with a carrier is laminated on both surfaces of the resin substrate or resin or prepreg, which is positioned at the center, in an order of a carrier/an intermediate layer/an ultrathin copper layer or an ultrathin copper layer/an intermediate layer/a carrier, or a laminate having a configuration in which "a carrier/an intermediate layer/an ultrathin copper layer/a resin substrate or resin or prepreg/a carrier/an intermediate layer/an ultrathin copper layer" are laminated in this order may be used for the above-described method for fabricating a printed wiring board (coreless method). In addition, on the exposed surface of the ultrathin copper layer or the carrier at both ends of the laminate, a separate resin layer may be provided to form a circuit by further providing a copper layer or metal layer and thereafter processing the copper layer or metal layer. A separate resin layer may be further provided on the circuit so as to bury the circuit. Further, such formation of a circuit and a resin layer may be carried out one or more times (build-up method). And for the laminate formed in this way (hereinafter, also referred to as laminate B), a coreless substrate can be produced by peeling the ultrathin copper layer or the carrier of each copper foil provided with a carrier from the carrier or the ultrathin copper layer. For producing the above-described coreless substrate, two copper foils provided with a carrier can be used to produce a laminate having a configuration of an ultrathin copper layer/an intermediate layer/a carrier/a carrier/an intermediate layer/an ultrathin copper layer, a laminate having a configuration of a carrier/an intermediate layer/an ultrathin copper layer/an ultrathin copper layer/an intermediate layer/a carrier, or a laminate having a configuration of a carrier/an intermediate layer/an ultrathin copper layer/a carrier/an intermediate layer/an ultrathin copper layer as described below to use the laminate as the center. A coreless substrate can be produced by providing two layers of a resin layer and a circuit one or more times on surfaces of the ultrathin copper layers or the carriers on both sides of these laminates (hereinafter, also referred to as laminate A), and, after the two layers of the resin layer and the circuit have been provided, peeling the ultrathin copper layer or the carrier of each copper foil provided with a carrier from the carrier or the ultrathin copper layer. The above-described laminate may have another layer on the surface of the ultrathin copper layer, on the surface of the carrier, between the carriers, between the ultrathin copper layers, or between the ultrathin copper layer and the carrier. The other layer may be a resin substrate or a resin layer. In the present specification, in the case that an ultrathin copper layer, a carrier, or a laminate has another layer on the ultrathin copper layer surface, the carrier surface, or the laminate surface, "surface of an ultrathin copper layer," "ultrathin copper layer side surface," "ultrathin copper layer surface," "surface of a carrier," "carrier side surface," "carrier surface," "surface of a laminate," and "laminate surface" are a concept also including the surface (outermost surface) of the another layer. Further, the laminate preferably has a configuration of an ultrathin copper layer/an intermediate layer/a carrier/a carrier/an intermediate layer/an ultrathin copper layer. This is because, when a coreless substrate is produced using the laminate, the ultrathin copper layer is disposed on the coreless substrate side, which facilitates formation of a circuit on the coreless substrate using a modified semi-additive method. In addition, the reason is that, since the thickness of the ultrathin copper layer is small, it is easy to remove the ultrathin copper layer, which facilitates formation of a circuit on the coreless substrate using a semi-additive method after removing the ultrathin copper layer.

In the present specification, "laminate" which is not particularly stated as "laminate A" or "laminate B" indicates a laminate including at least a laminate A and a laminate B.

In the above-described method for fabricating a coreless substrate, when fabricating a printed wiring board using a build-up method, by covering a part or all of the edge face of the copper foil provided with a carrier or the above-described laminate (including laminate A) with a resin, the permeation of a chemical solution into the intermediate layer or a space between one copper foil provided with a carrier and another copper foil provided with a carrier constituting the laminate can be suppressed, and the separation of the ultrathin copper layer and the carrier and the corrosion of the copper foil provided with a carrier due to the permeation of a chemical solution can be prevented and yield can be improved. As the "resin covering a part or all of the edge face of the copper foil provided with a carrier" or the "resin covering a part or all of the edge face of the laminate" used here, a resin which can be used for the resin layer or a known resin can be used. Further, in the above-described method for fabricating a coreless substrate, when the copper foil provided with a carrier or the laminate is viewed in a plane, at least a part of the periphery of a laminated part of the copper foil provided with a carrier or the laminate (a laminated part of a carrier and an ultrathin copper layer, or a laminated part of one copper foil provided with a carrier and another copper foil provided with a carrier) may be covered with a resin or a prepreg. Further, a laminate (laminate A) formed by using the above-described method for fabricating a coreless substrate may have a configuration in which a pair of copper foils provided with a carrier are contacted with each other in a separable manner. Furthermore, when the copper foil provided with a carrier is viewed in a plane, all of the periphery of a laminated part or the whole surface of a laminated part of the copper foil provided with a carrier or the laminate (a laminated part of a carrier and an ultrathin copper layer, or a laminated part of one copper foil provided with a carrier and another copper foil provided with a carrier) may be covered with a resin or a prepreg. When the copper foil provided with a carrier is viewed in a plane, a resin or a prepreg is preferably larger than the copper foil provided with a carrier or the laminate or the laminated part of the laminate, and it is preferred to laminate the resin or prepreg on both sides of the copper foil provided with a carrier or laminate to make a laminate having a configuration in which the copper foil provided with a carrier or laminate is enveloped (covered) with the resin or prepreg. By adopting such a configuration, when the copper foil provided with a carrier or the laminate is viewed in a plane, the laminated part of the copper foil provided with a carrier or the laminate is covered with a resin or a prepreg, and it can be prevented for another member to touch from the lateral direction of this part, that is, the transverse direction against the lamination direction, and as a result, the peeling of the carrier and the ultrathin copper layer or copper foils provided with a carrier can be less likely to occur in handling. Further, by covering the periphery of a laminated part of the copper foil provided with a carrier or the laminate with a resin or a prepreg so as not to expose it, the above-described permeation of a chemical solution into the interface of this laminated part in a chemical solution treatment step can be prevented, and the corrosion and erosion of the copper foil provided with a carrier can be prevented. It should be noted that, when one copper foil provided with a carrier is separated from a pair of copper foils provided with a carrier of the laminate or when the carrier and the copper foil (ultrathin copper layer) of the copper foil provided with a carrier are separated from each other, the laminated part of the copper foil provided with a carrier or the laminate (the laminated part of the carrier and the ultrathin copper layer, or the laminated part of one copper foil provided with a carrier and another copper foil provided with a carrier) covered with a resin or a prepreg needs to be removed by cutting or the like.

The copper foil provided with a carrier according to the present invention may be laminated from the carrier side or the ultrathin copper layer side on the carrier side or the ultrathin copper layer side of another copper foil provided with a carrier according to the present invention to constitute a laminate. Further, the laminate may be a laminate obtained by directly laminating as necessary via an adhesive the carrier side surface or the ultrathin copper layer side surface of the one copper foil provided with a carrier and the carrier side surface or the ultrathin copper layer side surface of the another copper foil provided with a carrier. Furthermore, the carrier or the ultrathin copper layer of the one copper foil provided with a carrier and the carrier or the ultrathin copper layer of the another copper foil provided with a carrier may be bonded together. Here, in the case that the carrier or the ultrathin copper layer has a surface-treated layer, the "bonding" includes a mode in which they are bonded together via the surface-treated layer. In addition, a part or all of the edge face of the laminate may be covered with a resin.

Lamination of carriers can be carried out by simply stacking or, for example, by using the following methods.

(a) metallurgical bonding method: fusion welding (arc welding, TIG (tungsten/inert gas) welding, MIG (metal/inert gas) welding, resistance welding, seam welding, spot welding), pressure welding (ultrasonic welding, friction stir welding), and brazing and soldering;

(b) mechanical bonding method: caulking, bonding with a rivet (bonding with a self-piercing rivet and bonding with a rivet), and a stitcher; and (c) physical bonding method: an adhesive and a (double-sided) adhesive tape.

By bonding a part or all of one carrier and a part or all of the other carrier together using the above bonding method, a laminate having a configuration in which one carrier and the other carrier are laminated and contacted with each other in a separable manner can be fabricated. If one carrier and the other carrier are laminated in a state that one carrier and the other carrier are weakly bonded together, one carrier and the other carrier are separable from each other even without removing the bonding part of one carrier and the other carrier. On the other hand, if one carrier and the other carrier are strongly bonded together, one carrier and the other carrier can be separated from each other by removing the part to which one carrier and the other carrier bonds by cutting, chemical polishing (e.g., etching), mechanical polishing, or the like.

In addition, a printed wiring board without a core can be produced by performing a step of providing two layers of a resin layer and a circuit at least one time on the laminate configured in this way, and a step of, after the two layers of the resin layer and the circuit have been formed at least one time, peeling the ultrathin copper layer or the carrier from the copper foil provided with a carrier of the laminate. Further, two layers of a resin layer and a circuit may be provided on the surface of one side or both sides of the laminate.

The resin substrate, resin layer, resin, or prepreg to be used for the above-described laminate may be the resin layer described herein, and may include resins used for the resin layer described herein, resin curing agents, compounds, curing accelerators, dielectrics, reaction catalysts, cross-linking agents, polymers, prepregs, skeletal materials, and the like.

Further, the above-described copper foil provided with a carrier or laminate may be smaller than the resin or prepreg or resin substrate or resin layer when being viewed in a plane.

EXAMPLES

Hereinafter, the present invention will be described in more detail using Examples of the present invention, but the present invention is never limited to these Examples in any way.

Examples 1 to 9, 14 to 18, and Comparative Examples 1 to 5

In an electrolytic chamber, a titanium electrolytic drum was disposed and an electrode was disposed around the drum with a given interelectrode distance therefrom. Next, electrolysis was performed in the electrolytic chamber under the following conditions to deposit copper on the surface of the electrolytic drum, and the copper deposited on the surface of the electrolytic drum was peeled off to continuously fabricate an electrolytic copper foil having a thickness of 18 μm as a carrier.

Here, the electrolysis conditions for fabricating the carrier are as follows.
Copper concentration: 30 to 120 g/L
$H_2SO_4$ concentration: 20 to 120 g/L
Electrolyte temperature: 20 to 80° C.
Current density: 10 to 100 A/dm$^2$ Here, as the electrolytic drum used for forming the above carrier, an electrolytic drum which had been polished in advance by using the following method was used. In the polishing method, as illustrated in FIG. 5, the polishing belt was contacted to polish the electrolytic drum in the rolling direction (MD direction) while rolling the electrolytic drum and simultaneously the polishing belt was moved with oscillation also in the TD direction of the electrolytic drum to thereby polish the electrolytic drum in the TD direction as well. Here, a titanium drum was used as the electrolytic drum, and a polishing belt manufactured by Hitachi Koki Co., Ltd. (particle size #320 endless polishing belt, type and particle size of abrasive grain: AA 320 (AA: alumina)) was used as the polishing belt. The TD direction length of the electrolytic drum was 2,400 mm and the width of the polishing belt was 100 mm. The oscillation width of the polishing belt in the TD direction, the movement of the polishing belt in the TD direction (stroke: the number of returns of the center of the polishing belt to the same position in the TD direction of the electrolytic drum surface within a certain time), the moving speed (carriage speed) of the polishing belt in the TD direction, and the rotation speed of the electrolytic drum are shown in Table 1.

Subsequently, a Ni layer having an amount to be deposited of 4,000 μg/dm$^2$ was formed on the drum surface (glossy surface) side of the above-described carrier as an intermediate layer by electroplating with a roll-to-roll continuous plating line under the following conditions.
Ni Layer
Nickel sulfate: 250 to 300 g/L
Nickel chloride: 35 to 45 g/L
Nickel acetate: 10 to 20 g/L
Trisodium citrate: 15 to 30 g/L
Gloss agent: Saccharine, butynediol etc.
Sodium dodecyl sulfate: 30 to 100 ppm
pH: 4 to 6
Bath temperature: 50 to 70° C.
Current density: 3 to 15 A/dm$^2$ After the Ni layer surface formed in the above-described conditions had been washed with water and acid, a Cr layer having an amount to be deposited of 11 μg/dm2 was then deposited on the Ni layer with a roll-to-roll continuous plating line by an electrolytic chromate treatment under the following conditions.
Electrolytic Chromate Treatment
Solution composition: potassium dichromate 1 to 10 g/L, zinc 0 to 5 g/L
pH: 3 to 4
Solution temperature: 50 to 60° C.
Current density: 0.1 to 2.6 A/dm$^2$
Coulomb amount: 0.5 to 30 As/dm2

Example 10 to 13

For Examples 10 to 13, an intermediate layer was formed on the drum surface (glossy surface) side of the above-described carrier as follows.

Example 10

Intermediate Layer
(1) Ni—Mo Layer (Nickel-Molybdenum Alloy Plating)
A Ni—Mo layer having an amount to be deposited of 3,000 μg/dm$^2$ was formed by electroplating a carrier with a roll-to-roll continuous plating line under the following conditions. The specific plating conditions are shown below.
(Solution composition) Ni sulfate hexahydrate: 50 g/dm$^3$, sodium molybdate dihydrate: 60 g/dm$^3$, sodium citrate: 90 g/dm$^3$
(Solution temperature) 30° C.
(Current density) 1 to 4 A/dm$^2$
(Conduction time) 3 to 25 seconds Example 11

Intermediate Layer
(1) Ni Layer (Nickel Plating)
A Ni layer was formed under the same conditions as in Examples 1 to 9.
(2) Organic Substance Layer (Organic Substance Layer Formation Treatment)
Next, after the Ni layer surface formed in (1) had been washed with water and acid, an organic substance layer was then formed under the following conditions by showering and spraying the Ni layer surface with an aqueous solution having a solution temperature of 40° C. and a pH of 5 that included carboxybenzotriazole (CBTA) in a concentration of 1 to 30 g/L for 20 to 120 seconds.

Example 12

Intermediate Layer
(1) Co—Mo Layer (Cobalt-Molybdenum Alloy Plating)
A Co—Mo layer having an amount to be deposited of 4,000 μg/dm$^2$ was formed by electroplating a carrier with a roll-to-roll continuous plating line under the following conditions. The specific plating conditions are shown below.
(Solution composition) Co sulfate: 50 g/dm$^3$, sodium molybdate dihydrate: 60 g/dm$^3$, sodium citrate: 90 g/dm$^3$
(Solution temperature) 30° C.
(Current density) 1 to 4 A/dm$^2$
(Conduction time) 3 to 25 seconds Example 13

Intermediate Layer
(1) Cr Layer (Chromium Plating)
(Solution composition) $CrO_3$: 200 to 400 g/L, $H_2SO_4$: 1.5 to 4 g/L
(pH) 1 to 4
(Solution temperature) 45 to 60° C.
(Current density) 10 to 40 A/dm$^2$
(Conduction time) 1 to 20 seconds
Amount of Cr deposited: 350 μg/dm$^2$ After forming an intermediate layer, an ultrathin copper layer having a thickness of 0.8 to 5 μm was formed on the intermediate layer by electroplating under the following conditions to make a copper foil provided with a carrier. That is, in an electrolytic chamber, a titanium electrolytic drum was disposed and an electrode was disposed around the drum with a given interelectrode distance therefrom, and electrolysis was performed under the following conditions to form an ultrathin copper layer on the intermediate layer side surface of the carrier on which an intermediate layer had been formed.

Ultrathin Copper Layer
Copper concentration: 30 to 120 g/L
$H_2SO_4$ concentration: 20 to 120 g/L
Electrolyte temperature: 20 to 80° C.
Current density: 10 to 100 A/dm²

In Examples 1, 4, and 7, a roughened layer, a heat resistant-treated layer, a chromate layer, and a silane coupling-treated layer were further provided above the ultrathin copper layer. In Examples 2, 5, and 8, a heat resistant-treated layer, a chromate layer, and a silane coupling-treated layer were further provided above the ultrathin copper layer. In Examples 3, 6, and 9, a chromate layer and a silane coupling-treated layer were further provided above the ultrathin copper layer.

Roughening Treatment
Cu: 10 to 20 g/L
Co: 1 to 10 g/L
Ni: 1 to 10 g/L
pH: 1 to 4
Temperature: 40 to 50° C.
Current density Dk: 20 to 30 A/dm²
Time: 1 to 5 seconds
Amount of Cu deposited: 15 to 40 mg/dm²
Amount of Co deposited: 100 to 3,000 μg/dm²
Amount of Ni deposited: 100 to 1,000 μg/dm²

Heat Resistant Treatment
Zn: 0 to 20 g/L
Ni: 0 to 5 g/L
pH: 3.5
Temperature: 40° C.
Current density Dk: 0 to 1.7 A/dm²
Time: 1 second
Amount of Zn deposited: 5 to 250 μg/dm²
Amount of Ni deposited: 5 to 300 μg/dm²

Chromate Treatment
$K_2Cr_2O_7$
($Na_2Cr_2O_7$ or $CrO_3$): 2 to 10 g/L
NaOH or KOH: 10 to 50 g/L
ZnO or $ZnSO_4 7H_2O$: 0.05 to 10 g/L
pH: 7 to 13
Bath temperature: 20 to 80° C.
Current density 0.05 to 5 A/dm²
Time: 5 to 30 seconds
Amount of Cr deposited: 10 to 150 μg/dm²

Silane Coupling Treatment
Vinyltriethoxysilane aqueous solution
(Vinyltriethoxysilane concentration: 0.1 to 1.4 wt %)
pH: 4 to 5
Time: 5 to 30 seconds Evaluations were performed using the following methods for each of the copper foils provided with a carrier obtained in Examples and Comparative Examples as described above.

Thickness of Ultrathin Copper Layer

The thickness of an ultrathin copper layer of a copper foil provided with a carrier produced was measured using a gravimetric method.

First, after the weight of a copper foil provided with a carrier was measured, the ultrathin copper layer was peeled off to measure the weight of the obtained carrier, and the difference between the former and the latter was defined as the weight of the ultrathin copper layer. A 10 cm square sheet stamped out with a press machine was used as an ultrathin copper layer piece to be measured. And then, the thickness of an ultrathin copper layer was calculated using the following formula.

Thickness (μm) of ultrathin copper layer=weight (g) of ultrathin copper layer/{density of copper (8.94 g/cm³)×area of ultrathin copper layer (100 cm²)}×10⁴ (μm/cm)

An HF-400 manufactured by A&D Company, Limited was used as the gravimeter and an HAP-12 manufactured by Noguchi Press Co., Ltd. was used as the press machine.

Specular Gloss at 60°

After a copper foil provided with a carrier and a base material (GHPL-832NX-A manufactured by MITSUBISHI GAS CHEMICAL COMPANY, INC.) were lamination-pressed while heated at 220° C. for 2 hours, the carrier was peeled off based on JIS C 6471 (1995, the method for peeling off a copper foil was (1) Method A in 8.1.1 Types of Test Method in 8.1 Peel Strength of Copper Foil (a method in which a copper foil is peeled off in a direction with an angle of 90° relative to the copper foil-removing surface)) to expose the intermediate layer side surface of the ultrathin copper layer. Next, using a Handy Gloss Meter PG-1, a gross meter based on JIS Z8741 manufactured by NIPPON DENSHOKU INDUSTRIES Co., LTD., the specular gloss at 60° in the MD direction (rolling direction (longitudinal direction, travelling direction in an apparatus for fabricating a copper foil provided with a carrier)) and the specular gloss at 60° in the TD direction (traverse direction (width direction)) of the intermediate layer side surface of the ultrathin copper layer were each measured at an incident angle of 60°.

Measurement of Surface Roughness (Ten Point Average Roughness Rz)

After a copper foil provided with a carrier and a base material (GHPL-832NX-A manufactured by MITSUBISHI GAS CHEMICAL COMPANY, INC.) were lamination-pressed while heated at 220° C. for 2 hours, the copper foil carrier was peeled off based on JIS C 6471 (1995, the method for peeling off a copper foil was (1) Method A in 8.1.1 Types of Test Method in 8.1 Peel Strength of Copper Foil (a method in which a copper foil is peeled off in a direction with an angle of 90° relative to the copper foil-removing surface)) to expose the intermediate layer side surface of the ultrathin copper layer. Next, using the contact roughness meter Surfcorder SE-3C manufactured by Kosaka Laboratory Ltd., the ten point average roughnesses Rz in the MD direction (rolling direction (longitudinal direction, travelling direction in an apparatus for fabricating a copper foil provided with a carrier)) and in the TD direction (traverse direction (width direction)) of the intermediate layer side surface of the ultrathin copper layer were each measured based on JIS B0601-1982. Under conditions of a measurement reference length of 0.8 mm, an evaluation length of 4 mm, a cutoff value of 0.25 mm, and a conveying speed of 0.1 mm/sec, measurements were each performed at 10 different positions in the direction perpendicular to the travelling direction of an electrolytic copper foil (a copper foil provided with a carrier) (TD, i.e., width direction) in an apparatus for fabricating an electrolytic copper foil (a copper foil provided with a carrier), and the average value of the 10 measurements was defined as the value of the surface roughness (ten point average roughness Rz).

Process Capability Index: Cp

In a managed process, the capability of the process to achieve a quality is referred to as process capability. A larger Cp value as a process capability index indicates that the variability of holes is smaller than the standard and the precision of the size of a laser hole is higher. The process capability index Cp was calculated using the following formula for each of the samples.

$$Cp=(USL-LSL)/6\sigma$$

USL: upper limit value of standard (laser hole diameter ϕ60 μm (50+10 μm))
LSL: lower limit value of standard (laser hole diameter ϕ40 μm (50−10 μm))
σ: standard deviation of laser hole diameter
Laser Hole-Opening Properties After a copper foil provided with a carrier and a base material (GHPL-832NX-A manufactured by MITSUBISHI GAS CHEMICAL COMPANY, INC.) were lamination-pressed while heated at 220° C. for 2 hours, the copper foil carrier was peeled off based on JIS C 6471 (1995, the method for peeling off a copper foil was (1) Method A in 8.1.1 Types of Test Method in 8.1 Peel Strength of Copper Foil (a method in which a copper foil is peeled off in a direction with an angle of 90° relative to the copper foil-removing surface)) to expose the intermediate layer side surface of the ultrathin copper layer. And then, the exposed intermediate layer side surface of the ultrathin copper layer of the copper foil provided with a carrier was irradiated with one or two laser shots under the following conditions, and the hole shape after the irradiation was observed with a microscope to measure. For the "actual number" of hole openings in Table, hole opening was performed at 150 points and how many holes could not be opened actually (number of unopened holes) was observed. Here, the diameter of a hole was defined as the diameter of the smallest circle enclosing the hole.

Gas species: $CO_2$
Opening diameter of copper foil (targeted): 50 μm in diameter
Beam shape: top hat
Output: 2.40 mJ/10 μs (=240 W)
Pulse width: 33 μs
Number of shots:
1 shot (in the case that the thickness of an ultrathin copper layer is 0.8 to 2 μm)
2 shots (in the case that the thickness of an ultrathin copper layer is 3 to 5 μm)

The test conditions and the test results are shown in Table 1.

TABLE 1

| | Electrolytic Drum Polishing | | | Carrier Side Surface of Ultrathin Copper Layer After Peeling Ultrathin Copper Layer | | | | | | | |
|---|---|---|---|---|---|---|---|---|---|---|---|
| | | Stroke | | | Contact Roughness Meter Rz (μm) | | | Gloss (—) | | | Number of |
| | Foil Thickness (μm) | (Traverse Polishing) (strokes/min) | Carriage Speed (cm/min) | Drum Rotation Speed (rpm) | Rolling Direction MD | Traverse Direction TD | MD/TD | Rolling Direction MD | Traverse Direction TD | MD/TD | CP (50 ± 10 μm) | Unopened Holes (N = 150 holes) |
| Example 1 | 2 | 80 | 20 | 10 | 0.99 | 1.43 | 0.69 | 137 | 61 | 2.25 | 0.79 | 0 |
| Example 2 | 1.5 | 80 | 20 | 10 | 0.99 | 1.43 | 0.69 | 137 | 61 | 2.25 | 1.01 | 0 |
| Example 3 | 0.8 | 80 | 20 | 10 | 0.99 | 1.43 | 0.69 | 137 | 61 | 2.25 | 1.33 | 0 |
| Example 4 | 2 | 120 | 20 | 10 | 0.96 | 1.52 | 0.63 | 134 | 60 | 2.23 | 0.64 | 1 |
| Example 5 | 1.5 | 120 | 20 | 10 | 0.96 | 1.52 | 0.63 | 134 | 60 | 2.23 | 1.12 | 0 |
| Example 6 | 0.8 | 120 | 20 | 10 | 0.96 | 1.52 | 0.63 | 134 | 60 | 2.23 | 1.37 | 0 |
| Example 7 | 2 | 150 | 50 | 7 | 0.93 | 1.43 | 0.65 | 116 | 61 | 1.90 | 0.95 | 0 |
| Example 8 | 1.5 | 150 | 50 | 7 | 0.93 | 1.43 | 0.65 | 116 | 61 | 1.90 | 1.21 | 0 |
| Example 9 | 0.8 | 150 | 50 | 7 | 0.93 | 1.43 | 0.65 | 116 | 61 | 1.90 | 1.60 | 0 |
| Example 10 | 0.8 | 150 | 50 | 7 | 0.93 | 1.43 | 0.65 | 115 | 61 | 1.89 | 1.61 | 0 |
| Example 11 | 2 | 150 | 50 | 7 | 0.93 | 1.43 | 0.65 | 116 | 61 | 1.90 | 0.95 | 0 |
| Example 12 | 1.5 | 150 | 50 | 7 | 0.93 | 1.43 | 0.65 | 116 | 61 | 1.90 | 1.21 | 0 |
| Example 13 | 0.8 | 150 | 50 | 7 | 0.93 | 1.43 | 0.65 | 116 | 61 | 1.90 | 1.60 | 0 |
| Example 14 | 2 | 200 | 50 | 5 | 0.92 | 1.42 | 0.65 | 81 | 43 | 1.88 | 1.19 | 0 |
| Example 15 | 1.5 | 200 | 50 | 5 | 0.92 | 1.42 | 0.65 | 81 | 43 | 1.88 | 1.47 | 0 |
| Example 16 | 0.8 | 200 | 50 | 5 | 0.92 | 1.42 | 0.65 | 81 | 43 | 1.88 | 1.98 | 0 |
| Example 17 | 3 | 200 | 50 | 5 | 0.92 | 1.42 | 0.65 | 81 | 43 | 1.88 | 1.93 | 0 |
| Example 18 | 5 | 200 | 50 | 5 | 0.92 | 1.42 | 0.65 | 81 | 43 | 1.88 | 0.72 | 1 |
| Comparative Example 1 | 2 | 0 | 20 | 20 | 0.79 | 1.52 | 0.52 | 150 | 70 | 2.14 | 0.51 | 14 |
| Comparative Example 2 | 1.5 | 0 | 20 | 20 | 0.79 | 1.52 | 0.52 | 150 | 70 | 2.14 | 0.84 | 4 |
| Comparative Example 3 | 0.8 | 0 | 20 | 20 | 0.79 | 1.52 | 0.52 | 150 | 70 | 2.14 | 1.30 | 0 |
| Comparative Example 4 | 3 | 0 | 20 | 20 | 0.79 | 1.52 | 0.52 | 150 | 70 | 2.14 | 0.83 | 5 |
| Comparative Example 5 | 5 | 0 | 20 | 20 | 0.79 | 1.52 | 0.52 | 150 | 70 | 2.14 | 0.41 | 18 |

Evaluation Result

In any of Examples 1 to 18, the specular gloss at 60° in an MD direction of the intermediate layer side surface of the ultrathin copper layer was 140 or less or the specular gloss at 60° in a TD direction of the intermediate layer side surface of the ultrathin copper layer was 65 or less, and the laser hole-opening properties of the ultrathin copper layer were good.

In any of Comparative Examples 1 to 5, the specular gloss at 60° in an MD direction of the intermediate layer side surface of the ultrathin copper layer was more than 140 and the specular gloss at 60° in a TD direction of the intermediate layer side surface of the ultrathin copper layer was more than 65, and the laser hole-opening properties of the ultrathin copper layer were poor.

The invention claimed is:
1. A copper foil provided with a carrier comprising, in order, a carrier, an intermediate layer, and an ultrathin copper layer, wherein at least one of the following (a) and (b) is satisfied:

(a) a specular gloss at 60° in a machine direction (MD) of the intermediate layer side surface of the ultrathin copper layer is 140 or less;

(b) a specular gloss at 60° in a transverse direction (TD) of the intermediate layer side surface of the ultrathin copper layer is 65 or less, wherein a ten point average roughness Rz in the MD direction of the intermediate layer side surface of the ultrathin copper layer measured using a contact roughness meter is 1.5 µm or less.

2. The copper foil provided with a carrier according to claim 1, wherein a ten point average roughness Rz in the MD direction of the intermediate layer side surface of the ultrathin copper layer measured using a contact roughness meter is 0.80 µm or more.

3. The copper foil provided with a carrier according to claim 1, wherein a ten point average roughness Rz in the TD direction of the intermediate layer side surface of the ultrathin copper layer measured using a contact roughness meter is 1.7 µm or less.

4. The copper foil provided with a carrier according to claim 1, wherein a ten point average roughness Rz in the MD direction of the intermediate layer side surface of the ultrathin copper layer measured using a contact roughness meter/a ten point average roughness Rz in the TD direction of the intermediate layer side surface of the ultrathin copper layer measured using a contact roughness meter is 0.55 or more.

5. The copper foil provided with a carrier according to claim 1, comprising a resin layer provided above the ultrathin copper layer.

6. A laminate fabricated using a copper foil provided with a carrier according to claim 1.

7. A laminate comprising a copper foil provided with a carrier according to claim 1 and a resin, wherein a part or all of an edge face of the copper foil provided with a carrier is covered with the resin.

8. A laminate, wherein one copper foil provided with a carrier according to claim 1 is laminated from the carrier side or the ultrathin copper layer side on the carrier side or the ultrathin copper layer side of another copper foil provided with a carrier according to claim 1.

* * * * *